United States Patent
Hoya et al.

(10) Patent No.: US 10,998,309 B2
(45) Date of Patent: May 4, 2021

(54) SEMICONDUCTOR UNIT, SEMICONDUCTOR MODULE, AND SEMICONDUCTOR DEVICE HAVING TERMINAL REGION EXTENDING IN PARALLEL TO THE TRANSISTORS

(71) Applicant: Fuji Electric Co., Ltd., Kanagawa (JP)

(72) Inventors: Masashi Hoya, Nagano (JP); Katsumi Taniguchi, Nagano (JP); Naoyuki Kanai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 63 days.

(21) Appl. No.: 16/566,579

(22) Filed: Sep. 10, 2019

(65) Prior Publication Data
US 2020/0091140 A1    Mar. 19, 2020

(30) Foreign Application Priority Data

Sep. 14, 2018 (JP) .............................. JP2018-173060

(51) Int. Cl.
*H01L 23/498* (2006.01)
*H01L 27/06* (2006.01)
(Continued)

(52) U.S. Cl.
CPC ...... *H01L 27/0635* (2013.01); *H01L 23/3157* (2013.01); *H01L 23/49822* (2013.01); *H01L 23/5227* (2013.01)

(58) Field of Classification Search
CPC ......... H01L 23/49822; H01L 23/49833; H01L 23/522; H01L 23/5227; H01L 23/5389; H05K 7/02
See application file for complete search history.

(56) References Cited

U.S. PATENT DOCUMENTS 5,956,231 A * 9/1999 Yamada ................ H01L 23/049
361/728
2012/0241953 A1 9/2012 Yamada et al.
(Continued)

FOREIGN PATENT DOCUMENTS

JP  2007-236044 A   9/2007
JP  2012-119618 A   6/2012
(Continued)

OTHER PUBLICATIONS

Sekino et al., ""HPnC" Large-Capacity SiC Hybrid Module", Fuji Electric Journal 2017, vol. 90, No. 4, p. 228-232 (Cited in the related U.S. Appl. No. 16/781,801 and English abstract included as a concise explanation of relevance.).

(Continued)

*Primary Examiner* — Hoai V Pham
(74) *Attorney, Agent, or Firm* — Chen Yoshimura LLP

(57) ABSTRACT

A semiconductor unit includes: a plurality of transistor chips arranged in a plurality of parallel rows, each transistor chip respectively having a first main electrode on one surface and a second main electrode on another surface; a first conductor layer electrically connected to the first main electrodes of the transistor chips, both corner portions on one end of the first conductor layer being drawn out in a direction in which the rows of transistor chips run; a second conductor layer arranged between the both corner portions of the first conductor layer; and a wiring substrate that is arranged on a side of the second main electrodes of the plurality of transistor chips and includes a wiring layer electrically connected to the second main electrodes of the plurality of transistor chips and to the second conductor layer.

20 Claims, 11 Drawing Sheets

(51) Int. Cl.
*H01L 23/31* (2006.01)
*H01L 23/522* (2006.01)

(56) References Cited

U.S. PATENT DOCUMENTS

| | | |
|---|---|---|
| 2014/0355219 A1 | 12/2014 | Tada et al. |
| 2015/0138733 A1 | 5/2015 | Tsuda et al. |

FOREIGN PATENT DOCUMENTS

| | | |
|---|---|---|
| JP | 2014-236150 A | 12/2014 |
| JP | 2015-207685 A | 11/2015 |
| JP | 2015-213408 A | 11/2015 |
| WO | 2011/083737 A1 | 7/2011 |
| WO | 2014/030254 A1 | 2/2014 |
| WO | 2014/208450 A1 | 12/2014 |

OTHER PUBLICATIONS

U.S. Appl. No. 16/781,801, filed Feb. 4, 2020.

\* cited by examiner

SEMICONDUCTOR UNIT, SEMICONDUCTOR MODULE, AND SEMICONDUCTOR DEVICE HAVING TERMINAL REGION EXTENDING IN PARALLEL TO THE TRANSISTORS

BACKGROUND OF THE INVENTION

Technical Field

The present invention relates to a power semiconductor unit as well as to a semiconductor module and a semiconductor device which use a plurality of these semiconductor units.

Background Art

In the field of power semiconductor devices such as inverters that convert DC power to AC power, one-in-one semiconductor units which include a single set of a semiconductor switching device and a rectifier in a single package (hereinafter, "one-in-one semiconductor units") and two-in-one semiconductor modules which include two one-in-one semiconductor units in a single package (hereinafter, "two-in-one semiconductor modules") are used. Patent Document 1 proposes a high current capacity semiconductor device configuration in which a plurality of semiconductor modules are connected in parallel, each including, arranged facing one another, one-in-one semiconductor units having the source terminal, drain terminal, and gate terminal of a semiconductor switching device arranged in a lengthwise direction. A positive terminal busbar which connects the drain terminals and a negative terminal busbar which connects the source terminals are arranged closely in a parallel manner so as to reduce inductance.

Patent Document 2 discloses a semiconductor device in which one-in-one semiconductor units are arranged facing one another and positive terminal and negative terminal busbar principal surfaces are juxtaposed running parallel to the vertical direction. Patent Document 3 discloses arranging flat plate-shaped positive terminal and negative terminal busbars closely in a layered manner parallel to the principal surfaces of a semiconductor device. Patent Document 4 discloses a semiconductor device in which a plurality of one-in-one semiconductor units are arranged season to one another. Patent Document 5 discloses a semiconductor device in which a plurality of one-in-one semiconductor units, each including a wiring substrate having conductive posts fixed thereto, are integrated together. Patent Document 6 discloses a semiconductor device in which a plurality of two-in-one semiconductor modules, each including a wiring substrate having conductive posts connected thereto, are integrated together. Patent Document 7 discloses a semiconductor device which uses a plurality of two-in-one semiconductor modules in which portions of respective positive terminals and negative terminals are layered parallel to one another on upper portions of semiconductor elements. Patent Document 8 discloses a semiconductor device including two one-in-one semiconductor units, with a first main electrode of one being connected to a second main electrode of the other.

In Patent Documents 1, 2, 3, 6, and 7, busbars which respectively connect positive terminals and negative terminals are arranged parallel to one another so that current flows in opposite directions therethrough, thereby reducing parasitic inductance (floating inductance). In Patent Document 4, semiconductor units are arranged side by side, and current flowing through the semiconductor device of one semiconductor unit and current flowing through the semiconductor device of the next semiconductor unit are made to flow in opposite directions so as to reduce parasitic inductance. In high-power semiconductor modules and semiconductor devices, a plurality of semiconductor units are used connected together in parallel. Also, in the semiconductor units themselves, a plurality of main circuit chips can be used connected together in parallel for higher-power use cases. Patent Documents 1 to 8 do not discuss reducing parasitic inductance in one-in-one semiconductor units in which a plurality of main circuit chips are connected together in some arrangement.

Two-in-one semiconductor modules which function as half-wave rectifier (half-bridge) circuits include a positive-side one-in-one semiconductor unit (upper arm) and a negative-side one-in-one semiconductor unit (lower arm). A node between the upper arm and lower arm serves as an output connector and is connected to an output terminal. Due to the inductance between the DC terminals of the two-in-one semiconductor module, surge voltages and the like can occur during switching operation. Such events tend to have negative effects, and therefore there is a need to reduce parasitic inductance between DC terminals. In the two-in-one semiconductor module, the DC current path includes a positive terminal, a positive connector, the upper arm, the output connector, the lower arm, a negative connector, and a negative terminal. The sum of the inductances of each component on this current path becomes the inductance between the DC terminals of the two-in-one semiconductor module. Therefore, reducing the parasitic inductance of the overall two-in-one semiconductor module requires reducing the parasitic inductance of each component on this current path.

RELATED ART DOCUMENTS

Patent Documents

Patent Document 1: Japanese Patent Application Laid-Open Publication No. 2014-236150
Patent Document 2: Japanese Patent Application Laid-Open Publication No. 2007-236044
Patent Document 3: WO 2014/208450
Patent Document 4: Japanese Patent Application Laid-Open Publication No. 2015-207685
Patent Document 5: WO 2011/083737
Patent Document 6: Japanese Patent Application Laid-Open Publication No. 2012-119618
Patent Document 7: Japanese Patent Application Laid-Open Publication No. 2015-213408
Patent Document 8: WO 2014/030254

SUMMARY OF THE INVENTION

In light of the abovementioned problems, the present invention aims to provide a semiconductor unit that makes it possible to reduce at least some of overall parasitic inductance, as well as a semiconductor module and a semiconductor device which use a plurality of these semiconductor units.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor unit, comprising: a plurality of transistor chips arranged in a plurality of parallel rows each extending in a first direction, each transistor chip respectively having a first main electrode on a bottom surface and a second main electrode on a top surface; a first conductor layer under the plurality transistor chips so as to be in contact with and electrically connected to the first main electrodes of the transistor chips, a first conductor layer having a terminal region on which a first external terminal vertically extending upwards is provided, the terminal region extending from one end of at least one of the parallels rows of the transistors in a plan view so as to provide a current path generally parallel to the first direction between the first external terminal and the first main electrodes of the row of the transistors from which the terminal region extends; a second conductor layer disposed in a same plane as the first conductor layer, the second conductor layer being arranged adjacent to the terminal region of the first conductor layer at a position that is generally aligned with the terminal region of the first conductor layer in a second direction perpendicular to the first direction, the second conductor layer having a second external terminal and a conductive post thereon both vertically extending upwards; and a wiring substrate above the plurality of transistor chips, including a wiring layer electrically connected to each of the second main electrodes of the plurality of transistor chips, the wiring substrate laterally extending to a region above the second conductor layer and the wiring layer being in contact with and electrically connected to the second conductor layer via the conductive post.

In another aspect, the present disclosure provides a semiconductor module, comprising: the semiconductor unit as set forth above, provided in pair, one of which being a first semiconductor unit and another of which being a second semiconductor unit, the first semiconductor unit and the second semiconductor unit being rotated 180 degrees relative to each other and being disposed side-by-side with each other in the first direction; a positive external terminal electrically connected via a positive connector to the first external terminal of the first semiconductor unit; a negative external terminal electrically connected via a negative connector to the second external terminal of the second semiconductor unit; and an output external terminal electrically connected to the second external terminal of the first semiconductor unit and the first external terminal of the second semiconductor unit, wherein a main surface of the positive connector and a main surface of the negative connector are arranged above and parallel to an upper surface of the first semiconductor unit so as to be separated from and face one another in a vertical direction above the first semiconductor unit.

In another aspect, the present disclosure provides a semiconductor device comprising the semiconductor module set forth above provided in a plurality, the plurality of the semiconductor modules being housed within an outer case, with the positive external terminal, the negative external terminal, and the output external terminal of each of the semiconductor modules being respectively exposed to an exterior.

At least some of the aspects of the present invention make it possible to provide a semiconductor unit that makes it possible to reduce overall parasitic inductance, as well as a semiconductor module and a semiconductor device which use a plurality of these semiconductor units.

DETAILED DESCRIPTION OF EMBODIMENTS

Figure 1:
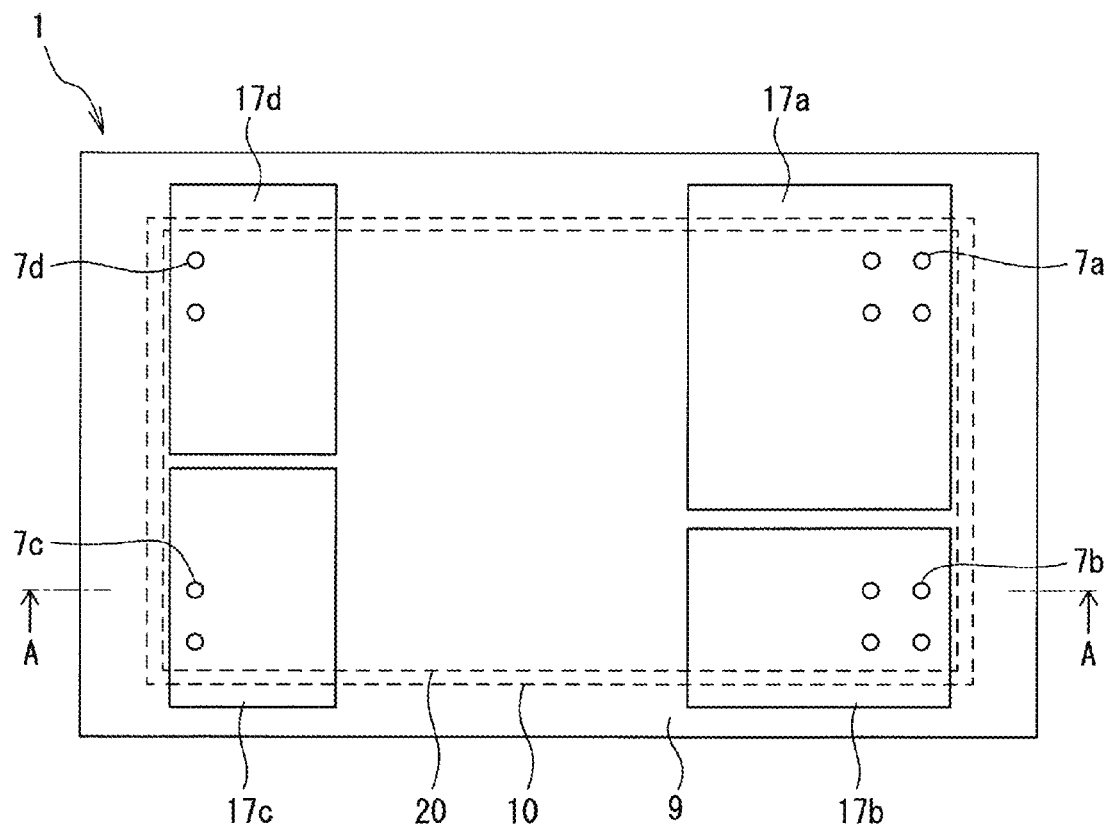
FIG. 1 is a plan view schematically illustrating an example of a semiconductor unit according to Embodiment 1 of the present invention.

Next, Embodiments 1 and 2 of the present invention will be described with reference to figures. In the following descriptions of the figures, the same or similar reference characters will be used for components that are the same or similar, and redundant descriptions will be omitted. However, the figures are only intended to be schematic illustrations, and the relationships between thickness and planar dimensions, the proportions between the thicknesses of each layer, and the like may be different from in the actual devices. Similarly, the illustrated dimensional relationships and proportions of components in the figures may differ from one figure to the next. Moreover, the embodiments described below are only examples of devices or methods for implementing the technical concept of the present invention, and the technical concept of the present invention does not limit the component part materials, shapes, structures, arrangements, or the like to those presented below.

In the present specification, the terms "first main electrode region" and "third main electrode region" of a semiconductor device which constitutes a transistor chip refer, in a field-effect transistor (FET) or a static induction transistor (SIT), to one semiconductor region among the source region and the drain region. In an insulated-gate bipolar transistor (IGBT), these terms refer to one semiconductor region among the emitter region and the collector region. Moreover, in a static induction thyristor (SI thyristor) or gate turn-off thyristor (GTO), these terms refer to one semiconductor region among the anode region and the cathode region. The terms "second main electrode region" and "fourth main electrode region" of a semiconductor device which constitutes a transistor chip refer, in a FET or a SIT, to the semiconductor region among the source region and the drain region that is not the abovementioned first main electrode region. In an IGBT, these terms refer to the region among the emitter region and the collector region that is not the first main electrode region. In an SI thyristor or GTO, these terms refer to the region among the anode region and the cathode region that is not the first main electrode region. Thus, if the first main electrode region and third main electrode region are source regions, the second main electrode region and fourth main electrode region would be drain regions. If the first main electrode region and third main electrode region are emitter regions, the second main electrode region and fourth main electrode region would be collector regions. If the first main electrode region and third main electrode region are anode regions, the second main electrode region and fourth main electrode region would be cathode regions. If the bias relationships are interchanged, in many cases the function of the first main electrode region and third main electrode region and the function of the second main electrode region and fourth main electrode region are interchangeable.

In the present specification, the source region of an MIS transistor is "one main electrode region (first or third main electrode region)" which can be selected as the emitter region of an insulated-gate bipolar transistor (IGBT). Moreover, in a thyristor such as an MIS-controlled static induction thyristor (SI thyristor), the one main electrode region can be selected as the cathode region. The drain region of an MIS transistor is "an other main electrode region (second or fourth main electrode region)" of a semiconductor device which can be selected as the collector region of an IGBT or as the anode region of a thyristor.

Embodiment 1

<Semiconductor Unit>

Figure 3:
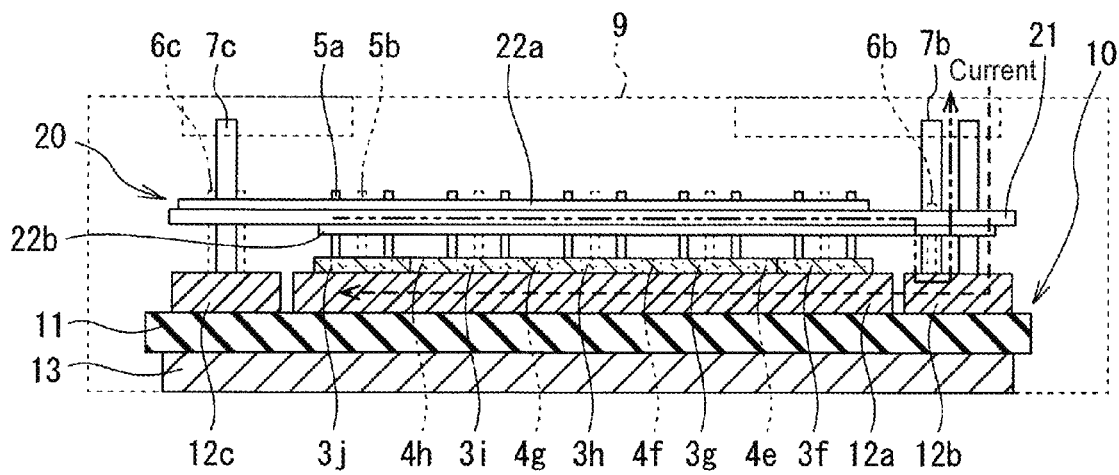
FIG. 3 is a cross-sectional view schematically illustrating the semiconductor unit as sectioned vertically along line A-A in FIG. 1.

As illustrated in FIGS. 1 and 3, a semiconductor unit 1 according to Embodiment 1 of the present invention includes electrode terminals (7a, 7b, 7c, and 7d) constituted by conductive pins, a resin 9, an insulated circuit board 10, and a wiring substrate 20. Rectangular recesses 17a, 17b, 17c, and 17d are formed in an upper surface of the resin 9. A first terminal (drain electrode pin) 7a, a second terminal (source electrode pin) 7b, a control electrode terminal (control electrode pin) 7c, and an auxiliary electrode terminal (auxiliary electrode pin) 7d are respectively arranged in the recesses 17a, 17b, 17c, and 17d. The insulated circuit board 10 and the wiring substrate 20 are housed within the resin (sealing resin) 9. The resin 9 has a rectangular shape when viewed in the plan view illustrated in FIG. 1. On one lengthwise end of the resin 9 (the right end in FIG. 1), the first terminal 7a and the second terminal 7b are arranged facing one another in the widthwise direction of the resin 9. On the other lengthwise end of the resin 9 (the left end in FIG. 1), the control electrode terminal 7c and the auxiliary electrode terminal 7d are arranged facing one another in the widthwise direction of the resin 9. The first terminal 7a and the auxiliary electrode terminal 7d face one another in the lengthwise direction of the resin 9, and the second terminal 7b and the control electrode terminal 7c face one another in the lengthwise direction of the resin 9.

Figure 2:
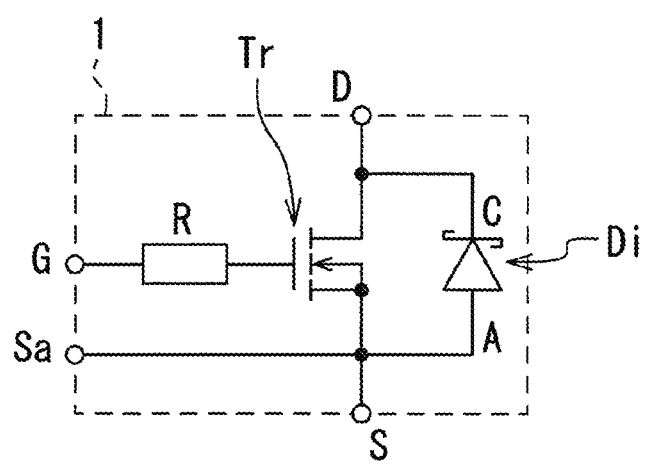
FIG. 2 is a circuit diagram illustrating an example of the semiconductor unit according to Embodiment 1 of the present invention.

As illustrated in FIG. 2, the semiconductor unit 1 according to Embodiment 1 includes a switching device Tr and a rectifier Di which is reverse-connected to the switching device Tr. The cathode electrode C of the rectifier Di is electrically connected to a first main electrode (drain electrode) D of the switching device Tr. The drain electrode (first main electrode) D is electrically connected to the first terminal (drain electrode pin) 7a of the semiconductor unit 1. The anode electrode A of the rectifier Di is electrically connected to a second main electrode (source electrode) S of the switching device Tr. The source electrode (second main electrode) S is electrically connected to the second terminal (source electrode pin) 7b of the semiconductor unit 1. A resistor R for adjusting switching speed or loss is connected to a control electrode (gate electrode) G of the switching device Tr. The gate electrode G is electrically connected to the control electrode terminal 7c of the semiconductor unit 1 illustrated in FIG. 1. An auxiliary source electrode Sa is an auxiliary electrode for detecting voltage or the like on the source electrode side and is electrically connected to the auxiliary electrode terminal 7d of the semiconductor unit 1 illustrated in FIG. 1.

It is preferable that the switching device Tr, which constitutes a transistor chip of the semiconductor unit 1 according to Embodiment 1, have an insulated-gate structure and be a vertical semiconductor device in which primary current flows in the depth direction of the transistor chip, such as an MIS transistor or an IGBT. It is preferable that the rectifier Di, which constitutes a diode chip of the semiconductor unit 1 according to Embodiment 1, be a vertical semiconductor device such as a fast recovery diode (FRD) or a Schottky barrier diode (SBD). Below, the switching device Tr will be described as being a vertical insulated-gate silicon carbide (SiC) MISFET, and the rectifier Di will be described as being an SiC SBD.

Here, the concept of an MIS transistor that constitutes the transistor chip includes MISFETs, MISSITs, and the like. In contrast to a MOS transistor, in which a silicon oxide film ($SiO_2$) film is used for the gate insulating film, "MIS transistor" is a more encompassing term referring to an insulated-gate transistor in which an insulating film other than an $SiO_2$ film can be used for the gate insulating film. In an MIS transistor, a silicon oxynitride (SiON) film, strontium oxide (SrO) film, silicon nitride ($Si_3N_4$) film, or aluminum oxide ($Al_2O_3$) film can be used for the gate insulating film. Alternatively, a magnesium oxide (MgO) film, yttrium oxide ($Y_2O_3$) film, hafnium oxide ($HfO_2$) film, zirconium oxide (ZrO2) film, tantalum oxide ($Ta_2O_5$) film, or bismuth oxide ($Bi_2O_3$) film may be used. Moreover, a composite film or the like in which several of these single-layer films are selected and layered together in plurality can be used. Furthermore, semiconductor materials other than SiC such as silicon (Si), gallium nitride (GaN), diamond, and aluminum nitride (AlN) can respectively be used as the semiconductor material.

Figure 4:
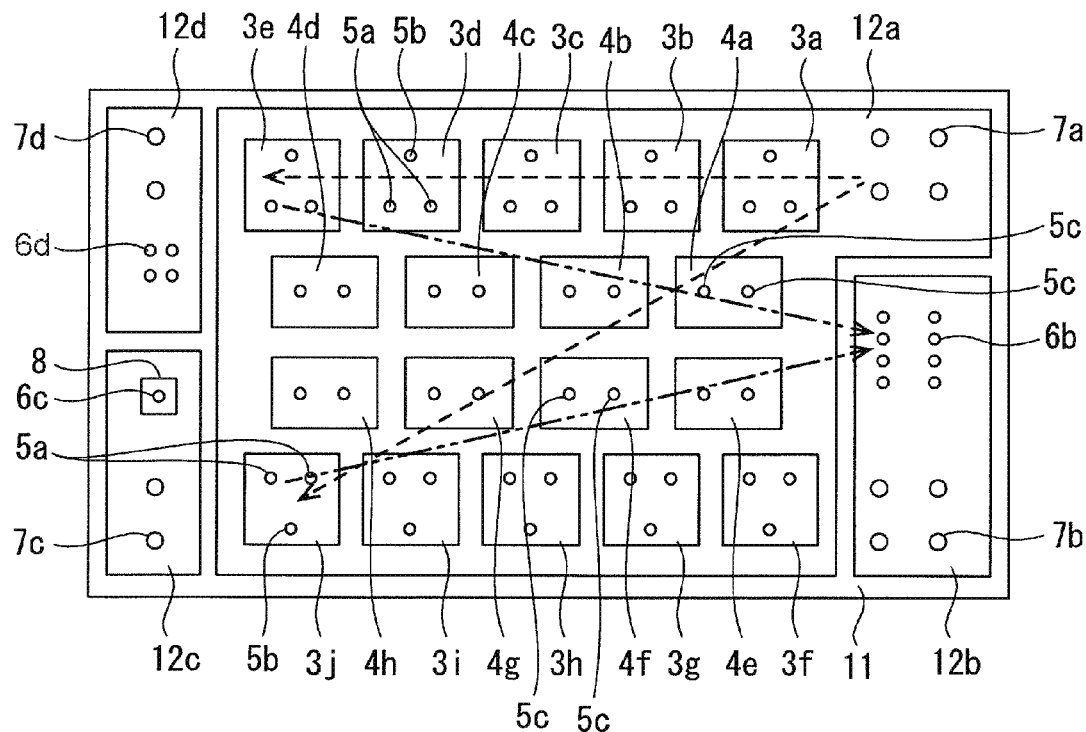
FIG. 4 is a plan view schematically illustrating an example of a semiconductor chip arrangement used in the semiconductor unit according to Embodiment 1 of the present invention.

As illustrated in FIGS. 3 and 4, the insulated circuit board 10 of the semiconductor unit 1 according to Embodiment 1 includes an insulating board 11; conductor layers 12a, 12b, 12c, and 12d patterned on an upper surface of the insulating board 11; and a conductor layer 13 formed on a bottom surface of the insulating board 11. A direct-bonded copper (DBC) substrate in which copper is eutectically bonded to the surface of a ceramic substrate, an active metal brazing (AMB) substrate in which metal is arranged on the surface of a ceramic substrate using an AMB process, or the like can be used for the insulated circuit board 10, for example. Examples of materials that can be used for the ceramic substrate include silicon nitride ($Si_3N_4$), aluminum nitride (AlN), alumina ($Al_2O_3$), and the like. The wiring substrate 20 is a standard printed circuit board and includes a wiring layer 22a and a wiring layer 22b respectively formed on an upper surface and a lower surface of a resin board 21. As illustrated in FIG. 3, a plurality of through holes are formed in the wiring substrate 20. Conductive posts (5a, 5b, 5c, 6b, 6c, and 6d) are inserted into through vias formed by plating the interior sides of the through holes with a conductor and are electrically connected to one or both of the wiring layers 22a and 22b. Moreover, the first terminal 7a, the second terminal 7b, the control electrode terminal 7c, and the auxiliary electrode terminal 7d are inserted into through holes that are electrically insulated from the wiring layers 22a and 22b.

As illustrated in FIGS. 3 and 4, a plurality of semiconductor chips (3a, 3b, 3c, 3d, 3e, 3f, 3g, 3h, 3i, 3j, 4a, 4b, 4c, 4d, 4e, 4f, 4g, and 4h) are arranged on the conductor layer 12a of the insulated circuit board 10. The semiconductor chips (3a to 3j and 4a to 4h) include transistor chips 3a to 3j which constitute the switching device Tr in FIG. 2 and diode chips 4a to 4h which constitute the rectifier Di in FIG. 2. As illustrated in FIG. 4, the transistor chips 3a, 3b, 3c, 3d, and 3e are arranged in a row running in the lengthwise direction (that is, the lengthwise direction of the semiconductor unit 1) along the upper edge of the insulated circuit board 10. The transistor chips 3f, 3g, 3h, 3i, and 3j are arranged in a row running in the lengthwise direction (that is, the lengthwise direction of the semiconductor unit 1) along the lower edge of the insulated circuit board 10. The diode chips 4a to 4h are arranged in the center of the insulated circuit board 10 between the row of transistor chips 3a to 3e and the row of transistor chips 3f to 3j. The diode chips 4a to 4d are arranged on the transistor chip 3a to 3e side, and the diode chips 4e to 4h are arranged on the transistor chip 3f to 3j side. Note that although Embodiment 1 is described as using ten transistor chips 3a to 3j and eight diode chips 4a to 4h, the numbers of chips are not limited.

At a bottom surface where the semiconductor chips (3a to 3j and 4a to 4h) contact the conductor layer 12a of the insulated circuit board 10, the drain electrode of the switching device Tr and the cathode electrode of the rectifier Di in FIG. 2 are formed. Moreover, as illustrated in FIG. 4, the first terminal 7a is electrically connected to near the upper right corner of the conductor layer 12a. Therefore, the drain electrode of the switching device Tr and the cathode electrode of the rectifier Di are electrically connected to the first terminal 7a.

Meanwhile, source electrodes and gate electrodes are formed on respective upper surfaces of the transistor chips 3a to 3j. Anode electrodes are formed on respective upper surfaces of the diode chips 4a to 4h. The conductive posts (first conductive posts) 5a, for example, are electrically connected to the source electrodes of the transistor chips 3d and 3j and respectively stand up orthogonally from the source electrodes of the transistor chips 3d and 3j. Main electrode posts other than the conductive posts (5a to 5c and 6b to 6d) stand up orthogonally from the respective source electrodes of the transistor chips 3a to 3c and 3e to 3i in a manner similar to the conductive posts 5a, although reference characters for these main electrode posts are omitted in FIG. 4. Similarly, control electrode posts 5b are electrically connected to the respective gate electrodes of the transistor chips 3d and 3j and stand up orthogonally from the gate electrodes of the transistor chips 3d and 3j. Other control electrode posts are electrically connected to the respective gate electrodes of the transistor chips 3a to 3c and 3e to 3i and stand up orthogonally from the respective gate electrodes of the transistor chips 3a to 3c and 3e to 3i in a manner similar to the control electrode posts 5b, although reference characters for these control electrode posts are omitted in FIG. 4. Furthermore, anode posts 5c are electrically connected to the respective anode electrodes of the diode chips 4a and 4f and stand up orthogonally from the anode electrodes of the diode chips 4a and 4f. Other anode posts are electrically connected to the respective anode electrodes of the diode chips 4b to 4e, 4g, and 4h and stand up orthogonally from the respective anode electrodes of the diode chips 4b to 4e, 4g, and 4h in a manner similar to the anode posts 5c, although reference characters for these anode electrode posts are omitted. As a result, the conductive posts 5a and the anode posts 5c are electrically short-circuited by source wiring formed in the wiring layer 22b and auxiliary source wiring formed in the wiring layer 22a of the wiring substrate 20, for example. Meanwhile, the control electrode posts 5b stand up towards the wiring layer 22a of the wiring substrate 20 and are electrically connected to gate wiring formed in the wiring layer 22a.

As illustrated in FIGS. 3 and 4, the conductive posts 6b stand up from the conductor layer 12b of the insulated circuit board 10 towards the wiring substrate 20 and are electrically connected to the source wiring formed in the wiring layer 22b of the wiring substrate 20. Therefore, the respective source electrodes (second main electrodes) of the transistor chips 3a to 3j are electrically connected to the second terminal 7b via the conductor layer 12b. As illustrated in FIGS. 3 and 4, the conductive post 6c stands up towards the wiring substrate 20 from a resistor 8 electrically connected to the conductor layer 12c of the insulated circuit board 10 and is electrically connected to the gate wiring formed in the wiring layer 22a of the wiring substrate 20. Therefore, the respective gate electrodes of the transistor chips 3a to 3j are electrically connected to the control electrode terminal 7c via the conductor layer 12c. Moreover, the conductive posts 6d stand up from the conductor layer 12d of the insulated circuit board 10 towards the wiring substrate 20 and are electrically connected to the wiring layer 22b of the wiring substrate 20. Therefore, the respective source electrodes of the transistor chips 3a to 3j are electrically connected to the auxiliary electrode terminal 7d via the conductor layer 12d.

In FIGS. 3 and 4, current paths for when the switching device Tr of the semiconductor unit 1 illustrated in FIG. 2 is conducting current are illustrated. In FIGS. 3 and 4, the dashed lines indicate the outgoing paths of primary circuit current that flows from the first terminal 7a to the transistor chips 3a to 3j, and the two-dot chain lines indicate the return paths of primary circuit current that flows from the transistor chips 3a to 3j to the second terminal 7b. Here, a DC voltage is applied to the semiconductor unit 1, with the first terminal 7a being the positive electrode and the second terminal 7b being the negative electrode. As illustrated in FIGS. 3 and 4, a gate voltage is applied from the control electrode terminal 7c to the respective gate electrodes of the transistor chips 3a to 3j via the conductor layer 12c of the insulated circuit board 10, the resistor 8, the conductive post 6c, the gate wiring of the wiring substrate 20, and the control electrode posts 5b. The application of this gate voltage causes the transistor chips 3a to 3j to respectively take a current-conducting state. The primary circuit current flows from the first terminal 7a through the conductor layer 12a of the insulated circuit board 10 on the outgoing paths and then vertically through the transistor chips 3a to 3j from the respective drain electrodes to the respective source electrodes of the transistor chips 3a to 3j. Next, the primary circuit current flows from the respective source electrodes of the transistor chips 3a to 3j through the conductive posts 5a and to the wiring layer 22b of the wiring substrate 20 on the return paths. Then, the primary circuit current on the return paths flows through the conductive posts 6b and the conductor layer 12b of the insulated circuit board 10 to the second terminal 7b. Note that in FIGS. 3 and 4, the paths for current that flows from the first terminal 7a through the endmost transistor chips 3e and 3j are illustrated as representative examples.

Moreover, during freewheeling operation of the semiconductor unit 1, the switching device Tr in FIG. 2 is cut off, the rectifier Di takes a current-conducting state, and freewheeling current flows from the second terminal 7b to the first terminal 7a. Although this is not illustrated in the figures, this freewheeling current flows from the second terminal 7b through the conductor layer 12b of the insulated circuit board 10, the conductive posts 6b, the wiring layer 22b of the wiring substrate 20, and the anode posts 5c to the respective anode electrodes of the diode chips 4a to 4h. Next, the freewheeling current flows from the respective anode electrodes to the respective cathode electrodes of the diode chips 4a to 4h and then through the conductor layer 12a of the insulated circuit board 10 to the first terminal 7a.

In the semiconductor unit 1 according to Embodiment 1, on one lengthwise end of the resin 9 (the right end in FIG. 1), the first terminal 7a and the second terminal 7b are arranged facing one another in the widthwise direction of the resin 9. Moreover, the transistor chips 3a to 3e and the transistor chips 3f to 3j are respectively arranged, along both widthwise ends of the insulated circuit board 10, in two parallel rows which run in the lengthwise direction that is orthogonal to the widthwise direction. This makes it possible to arrange the first terminal 7a near the end of the row of transistor chips 3a to 3e and to arrange the second terminal 7b near the end of the row of transistor chips 3f to 3j. The primary circuit current of the semiconductor unit 1 flows from the first terminal 7a along outgoing current paths through the conductor layer 12a of the insulated circuit board 10 and to the respective drain electrodes of the row of transistor chips 3a to 3e and the row of transistor chips 3f to 3j. Then, the primary circuit current takes a branched path flowing up vertically through the respective transistor chips 3a to 3e and transistor chips 3f to 3j. Next, the primary circuit current passes through the respective source electrodes of the row of transistor chips 3a to 3e and the row of transistor chips 3f to 3j and is collected on a current path going through the wiring layer 22b of the wiring substrate 20. The primary circuit current then flows to the second terminal 7b, with this current path that goes through the wiring layer 22b of the wiring substrate 20 being the return path. In this way, the outgoing paths and return paths on the current paths along which the primary circuit current flows are arranged near one another in a parallel manner, with the respective current directions being substantially opposite. This reduces the mutual inductance between the first terminal 7a and second terminal 7b of the semiconductor unit 1, thereby making it possible to reduce the parasitic inductance of the semiconductor unit 1.

<Semiconductor Module>

Figure 5:
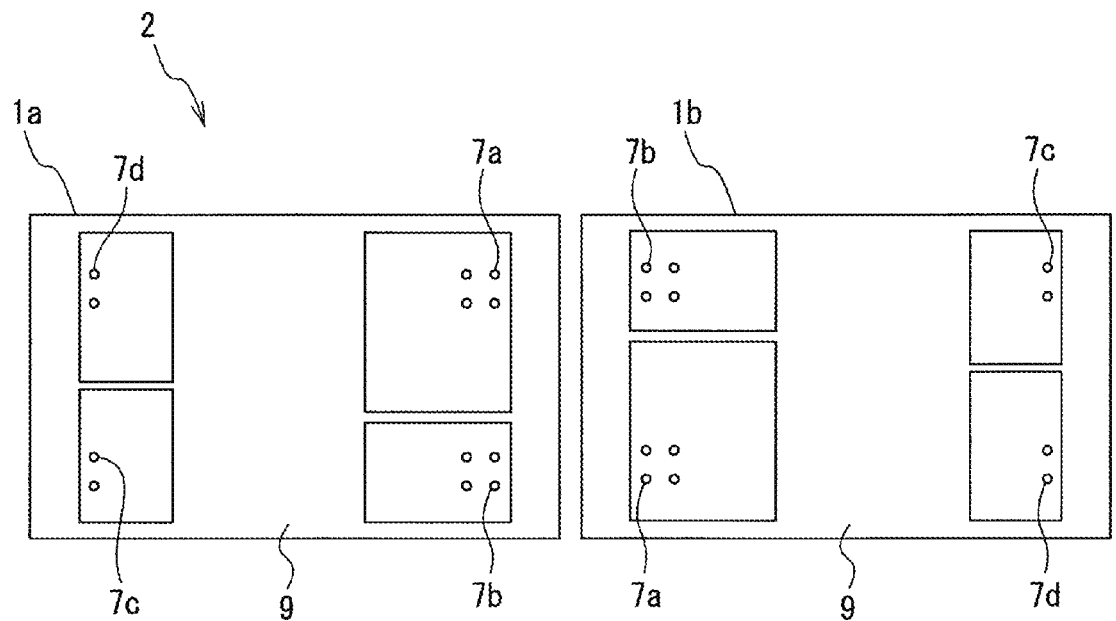
FIG. 5 is a plan view schematically illustrating an example of a semiconductor module according to Embodiment 1 of the present invention.

As illustrated in FIG. 5, a semiconductor module 2 according to Embodiment 1 is a two-in-one semiconductor module including a first semiconductor unit 1a and a second semiconductor unit 1b according to Embodiment 1. The semiconductor module 2 can be used as a half-wave rectifier circuit, for example, with the first semiconductor unit 1a being the upper arm and the second semiconductor unit 1b being the lower arm. In the semiconductor module 2, the second semiconductor unit 1b is rotated by 180° relative to the first semiconductor unit 1a such that the short sides of the respective resins 9 are arranged facing one another. As illustrated in FIG. 5, the first terminal 7a of the first semiconductor unit 1a is arranged facing a fourth connection terminal 7b of the second semiconductor unit 1b, and the second terminal 7b of the first semiconductor unit 1a is arranged facing a third connection terminal 7a of the second semiconductor unit 1b.

Figure 6:
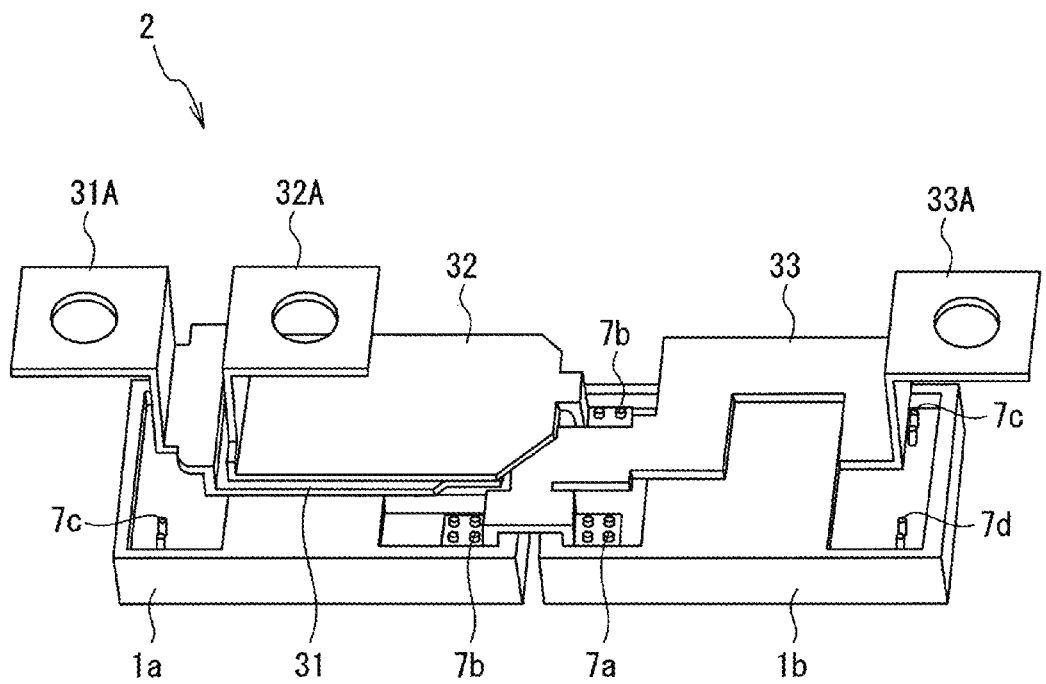
FIG. 6 is a perspective view illustrating an example of external terminals formed in the semiconductor module according to Embodiment 1 of the present invention.

As illustrated in FIG. 6, a flat plate-shaped positive connector 31 having a positive external terminal 31A formed on an end thereof is electrically connected to the first terminal 7a (not illustrated in the figure) of the first semiconductor unit 1a. A flat plate-shaped negative connector 32 having a negative external terminal 32A formed on an end thereof is electrically connected to the fourth connection terminal 7b of the second semiconductor unit 1b. A flat plate-shaped output connector 33 having an output external terminal 33A formed on an end thereof is electrically connected to the second terminal 7b of the first semiconductor unit 1a and the third connection terminal 7a of the second semiconductor unit 1b. The positive connector 31 extends, parallel to an upper surface of the first semiconductor unit 1a, towards an other short side which is on the side opposite to one short side where the first terminal 7a of the first semiconductor unit 1a is formed. The negative connector 32 is arranged near and parallel to the positive connector 31 and extends towards the other short side of the first semiconductor unit 1a. The output connector 33 extends, parallel to an upper surface of the second semiconductor unit 1b, towards an other short side which is on the side opposite to one short side where the third connection terminal 7a of the second semiconductor unit 1b is formed. Near the other short side of the first semiconductor unit 1a, the positive external terminal 31A and the negative external terminal 32A are arranged near one another and above or near the first semiconductor unit 1a. Near the other short side of the second semiconductor unit 1b, the output external terminal 33A is arranged above or near the second semiconductor unit 1b. This makes it possible to shorten the positive connector 31, the negative connector 32, and the output connector 33. Moreover, in order to allocate space for a gate external terminal and an auxiliary external terminal near the center of the second semiconductor unit 1b, the output connector 33 is arranged curving towards one widthwise side of the second semiconductor unit 1b. This increases the wiring length of the output connector 33 but does not result in any significant problems because a high-inductance load will be connected to the output terminal.

Figure 7:
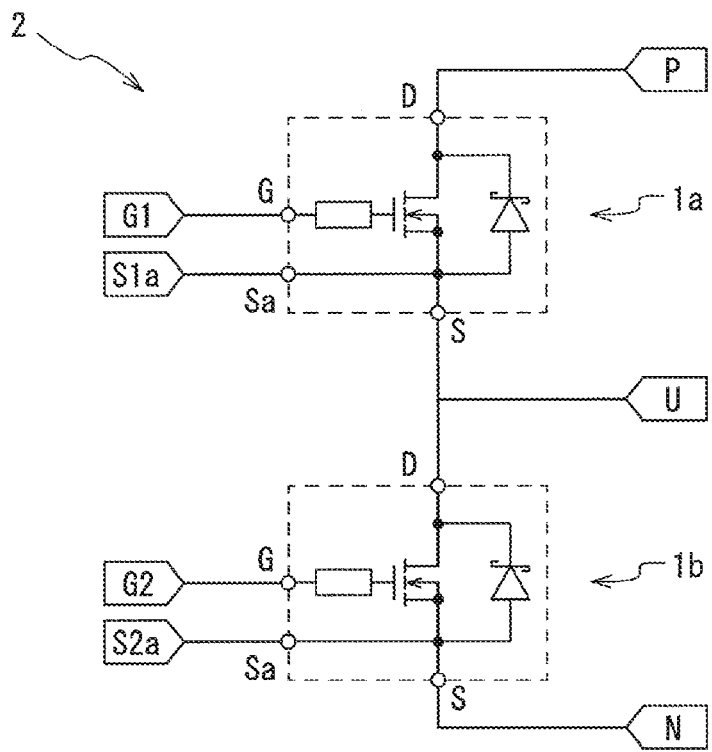
FIG. 7 is a circuit diagram illustrating an example of the semiconductor module according to Embodiment 1 of the present invention.

FIG. 7 is an equivalent circuit diagram of the semiconductor module 2 according to Embodiment 1. A P terminal in FIG. 7 corresponds to the positive external terminal 31A in FIG. 6. An N terminal in FIG. 7 corresponds to the negative external terminal 32A in FIG. 6. A U terminal in FIG. 7 corresponds to the output external terminal 33A in FIG. 6. A G1 terminal and an S1a terminal in FIG. 7 are respectively electrically connected to the gate electrode G and the auxiliary source electrode Sa of the first semiconductor unit 1a. A G2 terminal and an S2a terminal in FIG. 7 are respectively electrically connected to the gate electrode G and the auxiliary source electrode Sa of the second semiconductor unit 1b. As illustrated in FIG. 7, in the semiconductor module 2 according to Embodiment 1, a positive electrode and a negative electrode of an external power supply are respectively connected to the positive external terminal 31A and the negative external terminal 32A. When primary circuit current is passed between the positive external terminal 31A and the negative external terminal 32A, this primary circuit current flows in opposite directions on the current paths along the positive connector 31 and the negative connector 32, which are arranged near and parallel to one another. This makes it possible to reduce parasitic inductance on the external current paths constituted by the positive connector 31 and the negative connector 32 connected to the connection terminal 7a and the terminal 7b of the first semiconductor unit 1a and the second semiconductor unit 1b.

As described above, in each of the first semiconductor unit 1a and the second semiconductor unit 1b used in the semiconductor module 2 according to Embodiment 1, the mutual inductance between the first terminal 7a and the second terminal 7b can be reduced. Moreover, the mutual inductance between the positive connector 31 and the negative connector 32 of the semiconductor module 2 according to Embodiment 1 can also be reduced. Therefore, in the semiconductor module 2 according to Embodiment 1, the respective parasitic inductance of each current path going from the positive external terminal 31A to the negative external terminal 32A can be reduced. This makes it possible to reduce the overall parasitic inductance of the semiconductor module 2, thereby making it possible to suppress surge voltages applied during switching operation of the semiconductor module 2. Moreover, the positive connector 31, the negative connector 32, and the output connector 33 can be shortened, thereby making it possible to miniaturize the semiconductor module 2. Furthermore, in the semiconductor module 2 according to Embodiment 1, the positive external terminal 31A, the negative external terminal 32A, and the output external terminal 33A are arranged in that order in a row running in the lengthwise direction of the semiconductor module 2, similar to in a conventional two-in-one semiconductor module. Therefore, the semiconductor module 2 according to Embodiment 1 can easily be used in place of a conventional two-in-one semiconductor module.

<Semiconductor Device>

Figure 8:
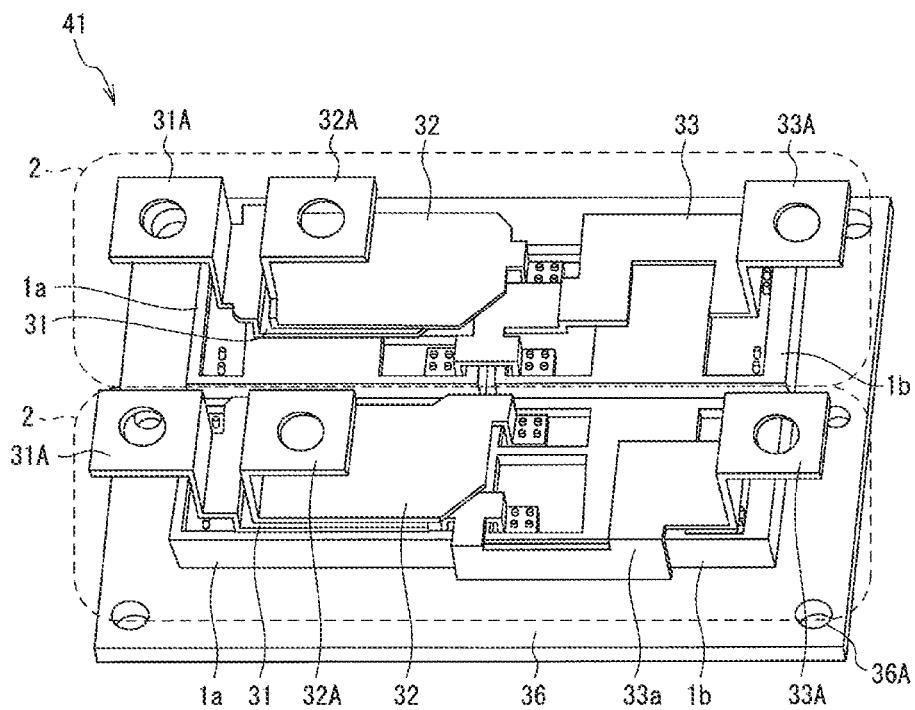
FIG. 8 is a perspective view illustrating an example of a semiconductor device according to Embodiment 1 of the present invention.
Figure 9:
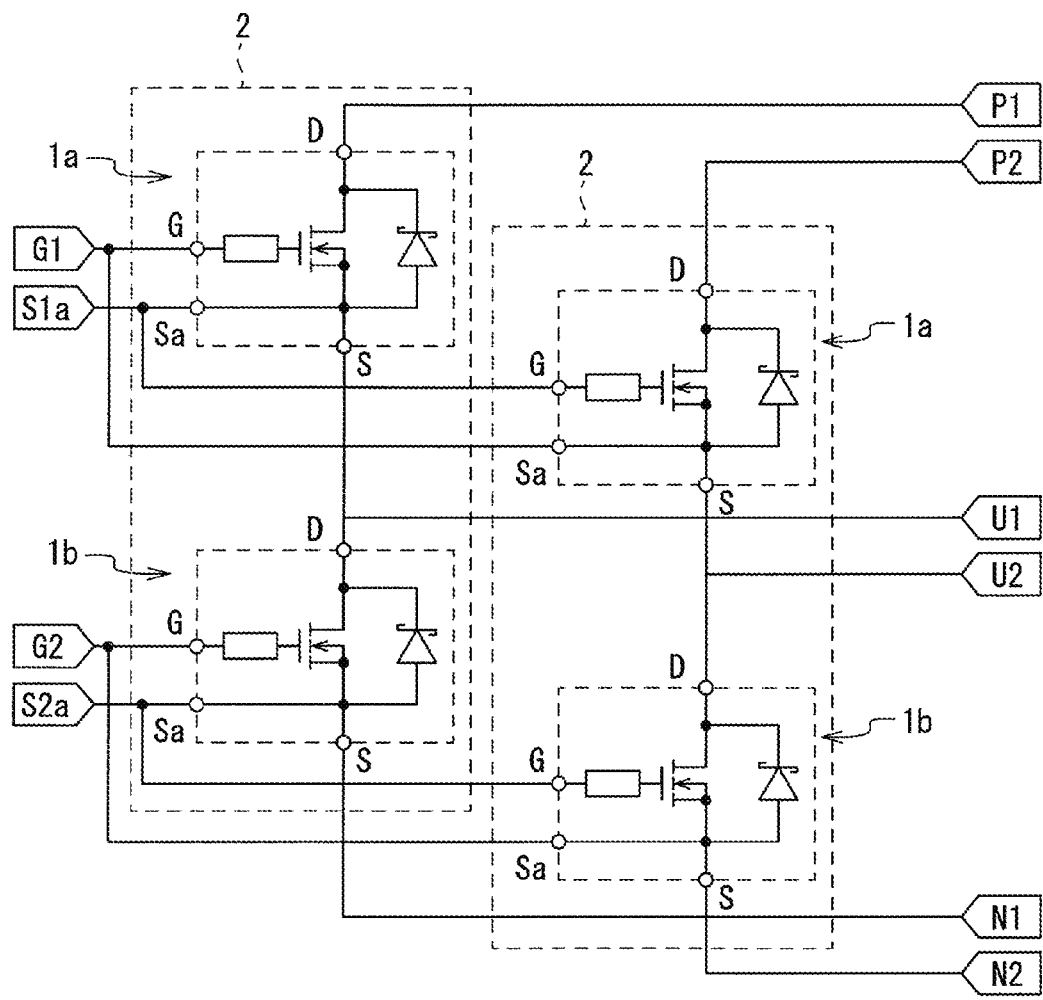
FIG. 9 is a circuit diagram illustrating an example of the semiconductor device according to Embodiment 1 of the present invention.

As illustrated in FIG. 8, a semiconductor device according to Embodiment 1 includes a plurality (two, for example) of the semiconductor modules 2 according to Embodiment 1. In the semiconductor device according to Embodiment 1, the semiconductor modules 2 can be arranged in parallel with the long sides thereof facing one another in order to achieve greater current capacity. FIG. 9 illustrates an equivalent circuit for the semiconductor device according to Embodiment 1. The positive external terminal 31A, the negative external terminal 32A, and the output external terminal 33A of one semiconductor module 2 in FIG. 8 respectively correspond to a P1 terminal, an N1 terminal, and a U1 terminal in FIG. 9. The positive external terminal 31A, the negative external terminal 32A, and the output external terminal 33A of the other semiconductor module 2 in FIG. 8 respectively correspond to a P2 terminal, an N2 terminal, and a U2 terminal in FIG. 9. A G1 terminal and an S1a terminal in FIG. 9 are respectively electrically connected to the gate electrode G and the auxiliary source electrode Sa of the first semiconductor unit 1a in both of the semiconductor modules 2 in FIG. 8. A G2 terminal and an S2a terminal in FIG. 9 are respectively electrically connected to the gate electrode G and the auxiliary source electrode Sa of the second semiconductor unit 1b in both of the semiconductor modules 2 in FIG. 8. In the semiconductor module 2 on the lower side in FIG. 8, in order to allocate space for the gate external terminal and the auxiliary external terminal, an output connector 33a is arranged bending from the upper surface of the second semiconductor unit 1b towards the sidewall thereof.

Figure 10:
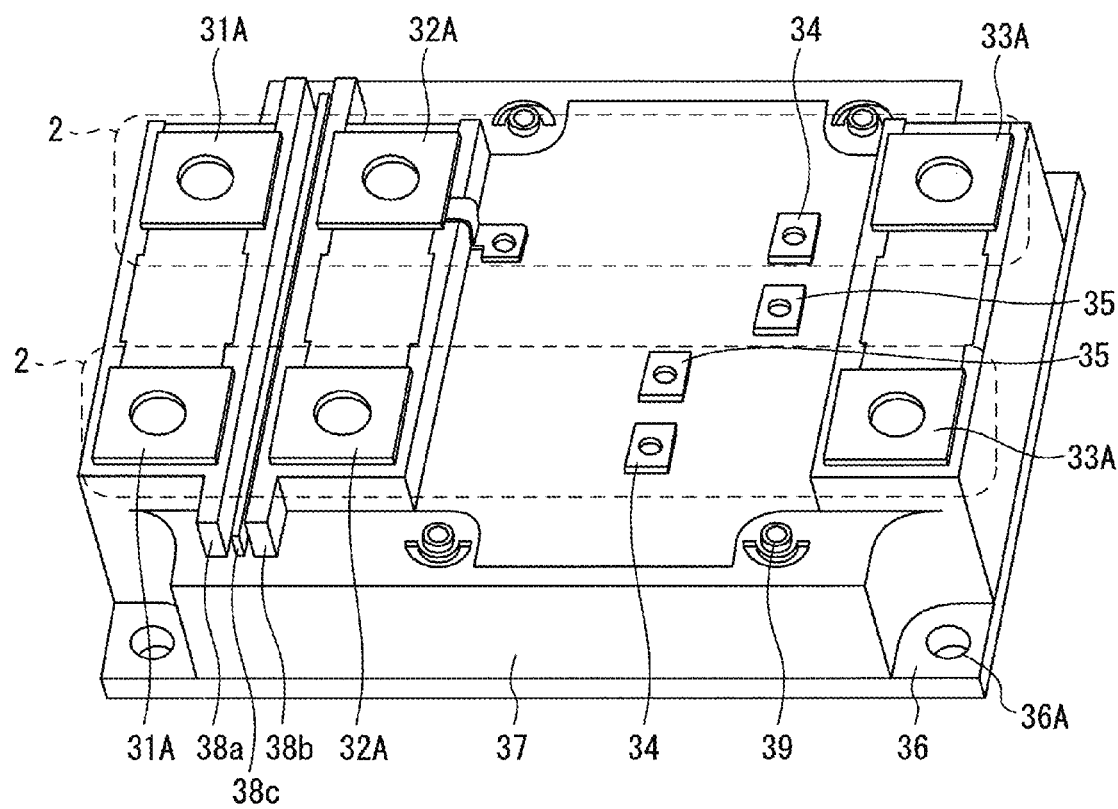
FIG. 10 is a perspective view illustrating an example of the semiconductor device according to Embodiment 1 of the present invention housed within an outer case.

As illustrated in FIG. 10, the semiconductor device according to Embodiment 1 is housed within an outer case 37, with the positive external terminals 31A, the negative external terminals 32A, the output external terminals 33A, control external terminals 34, and auxiliary external terminals 35 being exposed. The outer case 37, which is made of a resin, is supported by a support plate 36 having a plurality of mounting holes 36A. The semiconductor modules 2 are fixed to the support plate 36 using fixing members 39 such as screws. Moreover, guides 38a and 38b for connection plates that extend between the positive external terminals 31A and the negative external terminals 32A as well as a rib 38c for the connection plates are formed in an upper surface of the outer case 37. This makes it possible to easily connect connection plates such as conventional busbars to be electrically connected to the positive external terminals 31A and the negative external terminals 32A. For example, a positive connection plate to be electrically connected to the positive external terminals 31A is arranged between the guide 38a and the rib 38c, and a negative connection plate to be electrically connected to the negative external terminals 32A is arranged between the guide 38b and the rib 38c. Using the guides 38a and 38b and the rib 38c illustrated in FIG. 10, the positive connection plate and the negative connection plate are arranged parallel to and facing one another. This makes it possible to reduce the mutual inductance between the positive connection plate and the negative connection plate.

As described above, in each of the semiconductor modules 2 used in the semiconductor device according to Embodiment 1, the mutual inductance between the connection terminal 7a and the terminal 7b of each of the first semiconductor unit 1a and the second semiconductor unit 1b can be reduced. Moreover, the mutual inductance between the positive connector 31 and the negative connector 32 of each semiconductor module 2 can also be reduced. Furthermore, the mutual inductance between the connection plates that are electrically connected to the positive external terminals 31A and the negative external terminals 32A can also be reduced. Therefore, in the semiconductor device according to Embodiment 1, the respective parasitic inductance of each current path going from the connection plate that is connected to the positive external terminals 31A to the connection plate that is connected to the negative external terminals 32A can be reduced. This makes it possible to reduce the overall parasitic inductance of the semiconductor device according to Embodiment 1, thereby making it possible to suppress surge voltages applied during switching operation of the semiconductor modules 2.

Embodiment 2

<Semiconductor Unit>

Figure 11:
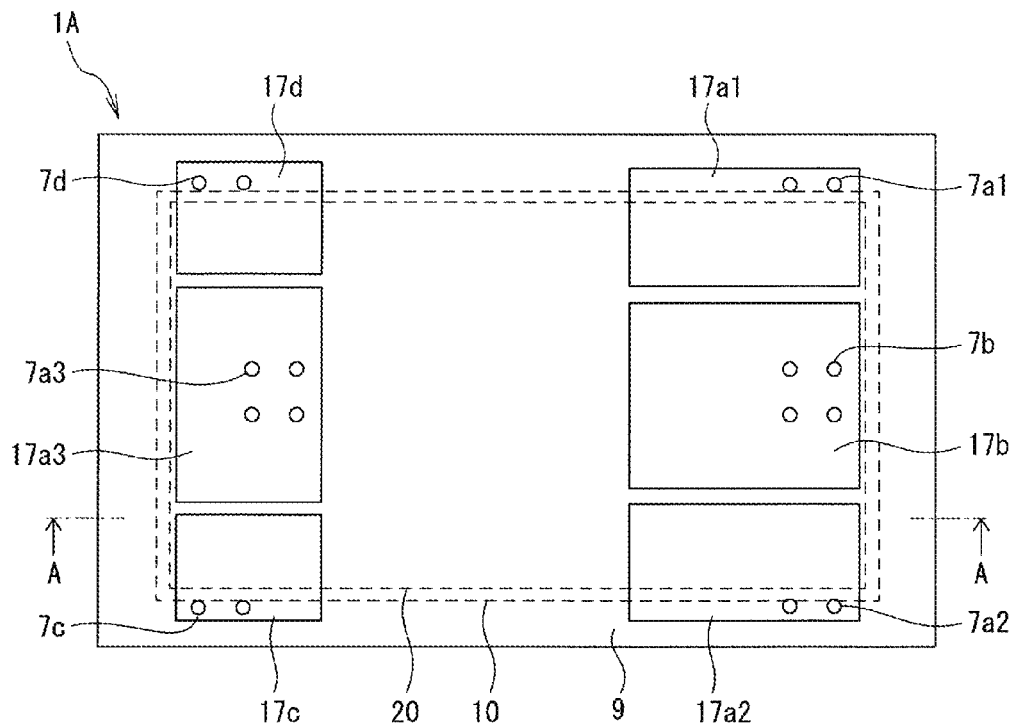
FIG. 11 is a plan view schematically illustrating an example of a semiconductor unit according to Embodiment 2 of the present invention.

As illustrated in FIG. 11, a semiconductor unit 1A according to Embodiment 2 of the present invention includes terminal pins (7a1, 7a2, 7a3, 7b, 7c, and 7d), a resin 9, an insulated circuit board 10, and a wiring substrate 20. A recess 17a1; a recess 17a2; and recesses 17a3, 17b, 17c, and 17d are formed in an upper surface of the resin 9. A first terminal 7a1, a first terminal 7a2, and a third terminal 7a3 are respectively arranged in the recesses 17a1, 17a2, and 17a3. The first terminal 7a1 and the first terminal 7a2 are arranged on either side of a second terminal 7b on one lengthwise end of the resin 9 (the right end in FIG. 11). The third terminal 7a3 is arranged between a control electrode terminal 7c and an auxiliary electrode terminal 7d on the other lengthwise end of the resin 9 (the left end in FIG. 11). The semiconductor unit 1A according to Embodiment 2 is different from Embodiment 1 in that the second terminal 7b is arranged between the first terminals 7a1 and 7a2 and in that the third terminal 7a3 is arranged between the control electrode terminal 7c and the auxiliary electrode terminal 7d. The rest of the configuration is similar to the semiconductor unit 1 according to Embodiment 1 and therefore will not be described again here.

Figure 12:
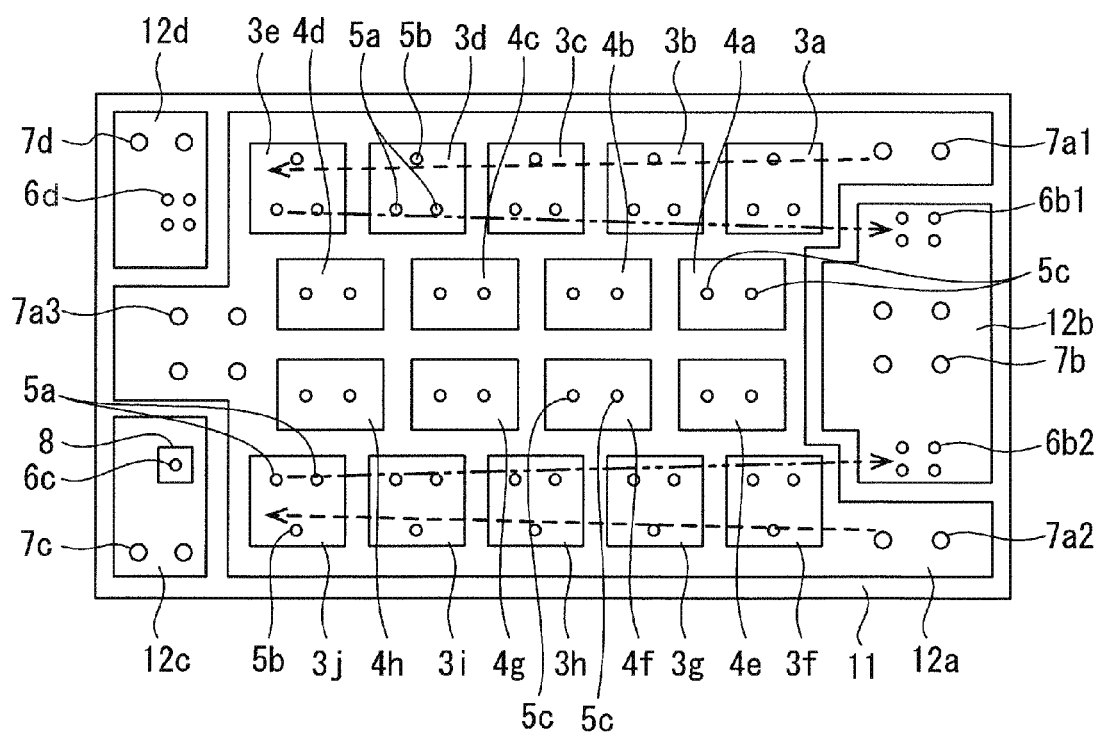
FIG. 12 is a plan view schematically illustrating an example of a semiconductor chip arrangement used in the semiconductor unit according to Embodiment 2 of the present invention.

As illustrated in FIG. 12, a plurality of semiconductor chips (3a to 3j and 4a to 4h) are arranged on the conductor layer 12a of the insulated circuit board 10. The semiconductor chips (3a to 3j and 4a to 4h) include a row of transistor chips 3a to 3e and a row of transistor chips 3f to 3j which constitute the switching device Tr in FIG. 2 as well as diode chips 4a to 4h which constitute the rectifier Di in FIG. 2. As illustrated in FIG. 12, the transistor chips 3a, 3b, 3c, 3d, and 3e are arranged in a row running in the lengthwise direction (that is, the lengthwise direction of the semiconductor unit 1A) along the upper edge of the insulated circuit board 10. The transistor chips 3f, 3g, 3h, 3i, and 3j are arranged in a row running parallel to the transistor chips 3a to 3e in the lengthwise direction (that is, the lengthwise direction of the semiconductor unit 1A) along the lower edge of the insulated circuit board 10. The diode chips 4a to 4h are arranged in the center of the insulated circuit board 10 between the row of transistor chips 3a to 3e and the row of transistor chips 3f to 3j. The diode chips 4a to 4d are arranged on the transistor chip 3a to 3e side, and the diode chips 4e to 4h are arranged on the transistor chip 3f to 3j side.

On the right end of the insulated circuit board 10 in FIG. 12, both corner portions on one end of the conductor layer 12a of the insulated circuit board 10 are drawn out in the direction in which the rows of transistor chips 3a to 3j run so as to form a U-shape that sandwiches the conductor layer 12b. The first terminals 7a1 and 7a2 are arranged on the oppositely disposed surfaces of the U-shaped conductor layer 12a so as to be on either side of the second terminal 7b. In the conductor layer 12b, on either side of the second terminal 7b, conductive posts (second conductive posts) 6b1 are arranged on the first terminal 7a1 side and conductive posts (second conductive posts) 6b2 are arranged on the first terminal 7a2 side. Thus, as illustrated in FIG. 12, both widthwise edge regions of the conductor layer 12b fall along the respective lines in which the row of transistor chips 3a to 3e and the row of transistor chips 3f to 3j run. Moreover, on the left end of the insulated circuit board 10 in FIG. 12, the center portion of the short side of the conductor layer 12a is formed protruding out between the conductor layer 12c and the conductor layer 12d. The third terminal 7a3 is arranged on this protruding portion of the conductor layer 12a so as to be between the control electrode terminal 7c and the auxiliary electrode terminal 7d.

In FIG. 12, the dashed lines indicate the outgoing paths of primary circuit current that flows from the first terminals 7a1 and 7a2 to the row of transistor chips 3a to 3e and the row of transistor chips 3f to 3j, and the two-dot chain lines indicate the return paths of primary circuit current that flows from the row of transistor chips 3a to 3e and the row of transistor chips 3f to 3j to the second terminal 7b. Here, a DC voltage is applied to the semiconductor unit 1A, with the first terminals 7a1 and 7a2 being positive electrodes and the second terminal 7b being the negative electrode. As illustrated in FIG. 12, a gate voltage is applied from the control electrode terminal 7c to the respective gate electrodes of the row of transistor chips 3a to 3e and the row of transistor chips 3f to 3j via the conductor layer 12c of the insulated circuit board 10, the resistor 8, the conductive post 6c, the gate wiring of the wiring substrate 20, and the control electrode posts 5b. The application of this gate voltage causes the row of transistor chips 3a to 3e and the row of transistor chips 3f to 3j to respectively take a current-conducting state. One primary circuit current flows from the first terminal 7a1 through the conductor layer 12a of the insulated circuit board 10 on the outgoing paths and then from the respective drain electrodes to the respective source electrodes of the transistor chips 3a to 3e. Moreover, another primary circuit current flows from the first terminal 7a2 through the conductor layer 12a of the insulated circuit board 10 on the outgoing paths and then from the respective drain electrodes to the respective source electrodes of the transistor chips 3f to 3j. Next, the one primary circuit current flows from the respective source electrodes of the transistor chips 3a to 3e through the conductive posts (first conductive posts) 5a to the wiring layer 22b of the wiring substrate 20 on the return paths and then flows through the conductive posts 6b1 and the conductor layer 12b to the second terminal 7b. Moreover, the other primary circuit current flows from the respective source electrodes of the transistor chips 3f to 3j through the conductive posts 5a to the wiring layer 22b of the wiring substrate 20 on the return paths and then flows through the conductive posts 6b2 and the conductor layer 12b to the second terminal 7b. Note that in FIG. 12, the paths for current that flows from the first terminals 7a1 and 7a2 through the endmost transistor chips 3e and 3j are illustrated as representative examples. Furthermore, during freewheeling operation of the semiconductor unit 1A, freewheeling current flows from the second terminal 7b to the first terminals 7a1 and 7a2.

In the semiconductor unit 1A according to Embodiment 2, on one lengthwise end of the resin 9 (the right end in FIG. 11), the first terminals 7a1 and 7a2 are arranged in both corner portions so as to be on either side of the second terminal 7b in the widthwise direction of the resin 9. Moreover, the transistor chips 3a to 3e are arranged in a row running in the lengthwise direction along one edge of the insulated circuit board 10 on the side on which the first terminal 7a1 is arranged (the upper edge in FIG. 12). The transistor chips 3f to 3j are arranged in a row running in the lengthwise direction along an other edge of the insulated circuit board 10 on the side on which the first terminal 7a2 is arranged (the lower edge in FIG. 12). This makes it possible to arrange the first terminals 7a1 and 7a2 and the second terminal 7b near one another. The primary circuit current of the semiconductor unit 1A flows from the first terminals 7a1 and 7a2 along outgoing current paths through the conductor layer 12a of the insulated circuit board 10 and to the respective drain electrodes of the row of transistor chips 3a to 3e and the row of transistor chips 3f to 3j. Next, the primary circuit current flows through the respective source electrodes of the row of transistor chips 3a to 3e and the row of transistor chips 3f to 3j, through a return current path going through the wiring layer 22b of the wiring substrate 20, and through the conductive posts 6b1 and 6b2 to the second terminal 7b. In Embodiment 2, on the outgoing paths for primary circuit current, current can be respectively passed from the first terminals 7a1 and 7a2 to the row of transistor chips 3a to 3e and the row of transistor chips 3f to 3j with good linearity. Moreover, on the return paths for primary circuit current, current can be respectively passed from the row of transistor chips 3a to 3e and the row of transistor chips 3f to 3j to the conductive posts 6b1 and 6b2 with good linearity. In this way, the outgoing paths and return paths on the current paths along which the primary circuit current flows are arranged near one another in a parallel manner, with the respective current directions being substantially opposite. Furthermore, the degree of parallelism between the outgoing paths and return paths for the primary circuit current is greater than in Embodiment 1. This, due to the effects of mutual inductance, makes it possible to further reduce the mutual inductance between the first terminals 7a1 and 7a2 and the second terminal 7b of the semiconductor unit 1A.

<Semiconductor Module>

Figure 13:
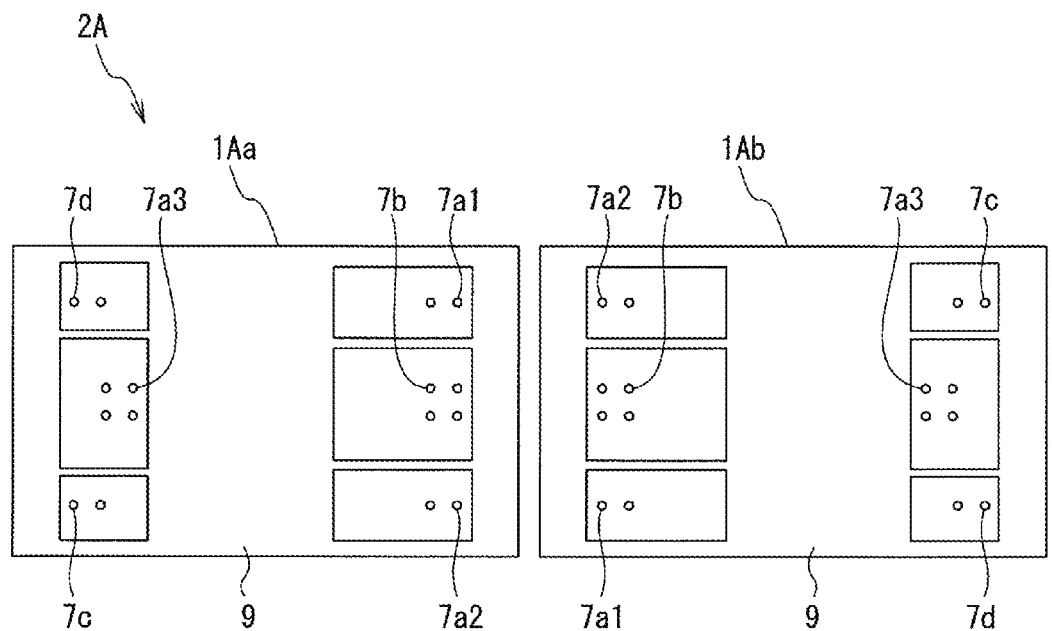
FIG. 13 is a plan view schematically illustrating an example of a semiconductor module according to Embodiment 2 of the present invention.

As illustrated in FIG. 13, a semiconductor module 2A according to Embodiment 2 is a two-in-one semiconductor module including a first semiconductor unit 1Aa and a second semiconductor unit 1Ab according to Embodiment 2. The semiconductor module 2A can be used as a half-wave rectifier circuit, for example, with the first semiconductor unit 1Aa being the upper arm and the second semiconductor unit 1Ab being the lower arm. In the semiconductor module 2A, the second semiconductor unit 1Ab is rotated by 180° relative to the first semiconductor unit 1Aa such that the short sides of the respective resins 9 are arranged facing one another. The first terminal 7a1 of the first semiconductor unit 1Aa faces the first terminal 7a2 of the second semiconductor unit 1Ab, and the first terminal 7a2 of the first semiconductor unit 1Aa faces the first terminal 7a1 of the second semiconductor unit 1Ab. Moreover, the second terminal 7b of the first semiconductor unit 1Aa is arranged facing the second terminal 7b of the second semiconductor unit 1Ab. The semiconductor module 2A according to Embodiment 2 is different from the semiconductor module 2 according to Embodiment 1 in that the first semiconductor unit 1Aa and the second semiconductor unit 1Ab are used. The rest of the configuration is similar to the semiconductor module 2 according to Embodiment 1 and therefore will not be described again here.

Figure 14:
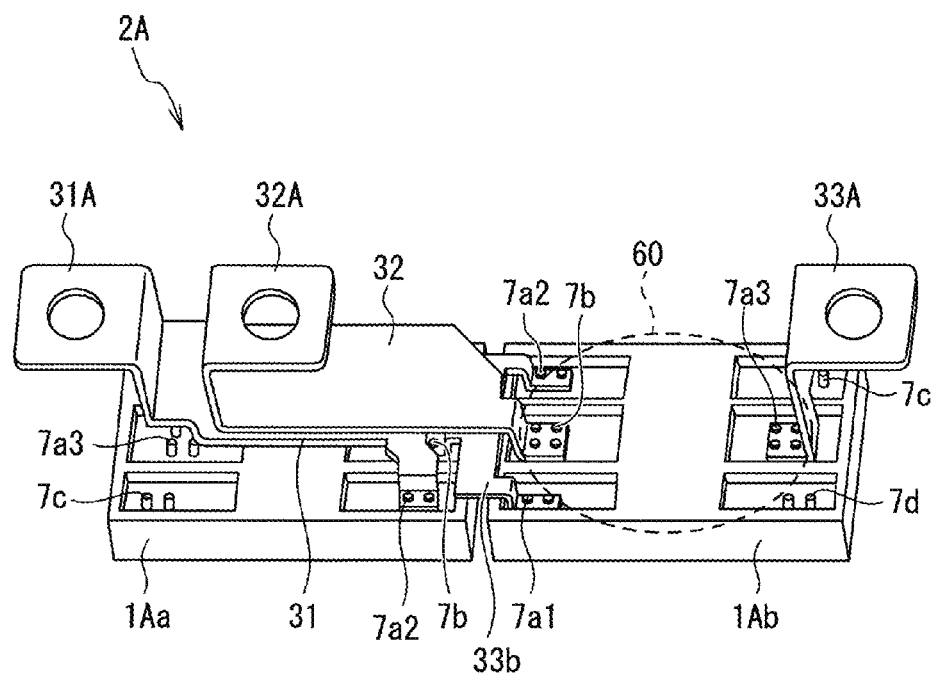
FIG. 14 is a perspective view illustrating an example of external terminals formed in the semiconductor module according to Embodiment 2 of the present invention.

As illustrated in FIG. 14, a flat plate-shaped positive connector 31 having a positive external terminal 31A formed on an end thereof is electrically connected to the first terminal 7a1 (not illustrated in the figure) and the first terminal 7a2 of the first semiconductor unit 1Aa. A flat plate-shaped negative connector 32 having a negative external terminal 32A formed on an end thereof is electrically connected to the second terminal 7b of the second semiconductor unit 1Ab. The second terminal 7b of the first semiconductor unit 1Aa and the first terminals 7a1 and 7a2 of the second semiconductor unit 1Ab are electrically connected via a middle connector 33b. An output terminal having an output external terminal 33A formed on an end thereof is electrically connected to the third terminal 7a3 of the second semiconductor unit 1Ab. The positive connector 31 extends, parallel to an upper surface of the first semiconductor unit 1Aa, towards an other short side where the third terminal 7a3 is formed and which is on the side opposite to one short side where the first terminals 7a1 and 7a2 of the first semiconductor unit 1Aa are formed. The negative connector 32 is arranged near and parallel to the positive connector 31 and extends towards the other short side of the first semiconductor unit 1Aa. Near the other short side of the first semiconductor unit 1Aa, the positive external terminal 31A and the negative external terminal 32A are arranged near one another and above or near the first semiconductor unit 1Aa. Near an other short side of the second semiconductor unit 1Ab, the output terminal is connected perpendicularly to the conductor layer 12a illustrated in FIG. 12, and the output external terminal 33A connected to the output terminal is arranged above or near the second semiconductor unit 1Ab. This makes it possible to shorten the positive connector 31, the negative connector 32, and the output connector 33. Moreover, in order to allocate space for a gate external terminal and an auxiliary external terminal near the center of the second semiconductor unit 1Ab, an auxiliary region 60 in which the output connector 33 connected to the output external terminal 33A is not arranged is formed. This makes it possible to simplify the wiring of the output connector 33.

As described above, in each of the first semiconductor unit 1Aa and the second semiconductor unit 1Ab used in the semiconductor module 2A according to Embodiment 2, the mutual inductance between the first terminals 7a1 and 7a2 and the second terminal 7b can be further reduced. Moreover, the mutual inductance between the positive connector 31 and the negative connector 32 of the semiconductor module 2A according to Embodiment 2 can also be reduced. Therefore, in the semiconductor module 2A according to Embodiment 2, the respective parasitic inductance of each current path going from the positive external terminal 31A to the negative external terminal 32A can be reduced. This makes it possible to reduce the overall parasitic inductance of the semiconductor module 2A, thereby making it possible to suppress surge voltages applied during switching operation of the semiconductor module 2A. Moreover, the positive connector 31, the negative connector 32, and the output connector 33 can be shortened, thereby making it possible to miniaturize the semiconductor module 2A. Furthermore, in the semiconductor module 2A according to Embodiment 2, the positive external terminal 31A, the negative external terminal 32A, and the output external terminal 33A are arranged in that order in a row running in the lengthwise direction of the semiconductor module 2A, similar to in a conventional two-in-one semiconductor module. Therefore, the semiconductor module 2A according to Embodiment 2 can easily be used in place of a conventional two-in-one semiconductor module.

<Semiconductor Device>

Figure 15:
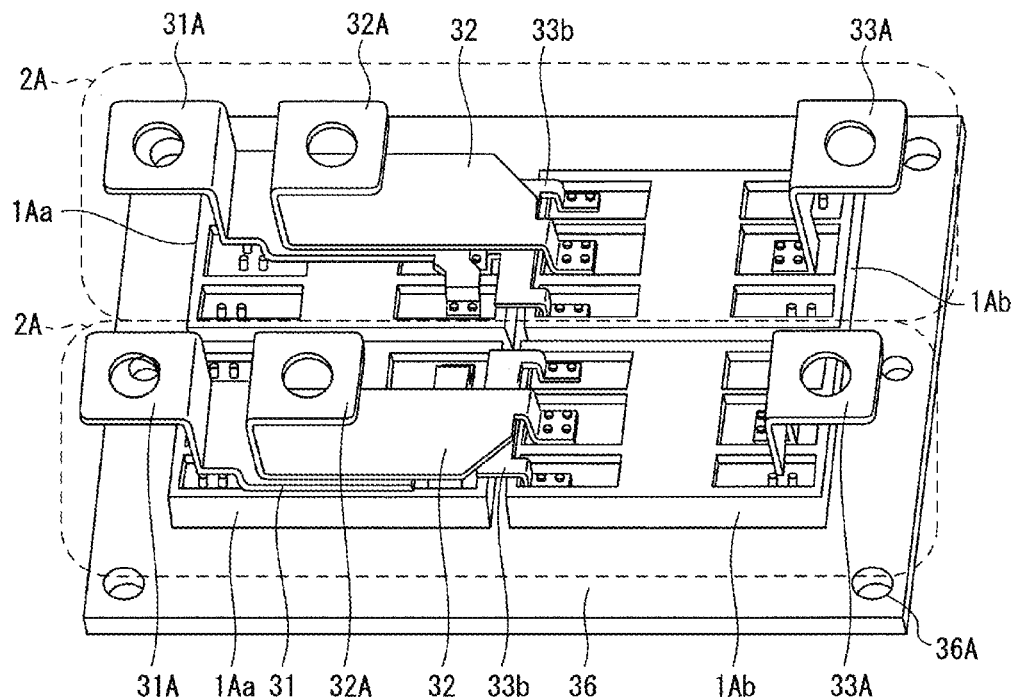
FIG. 15 is a perspective view illustrating an example of a semiconductor device according to Embodiment 2 of the present invention.

As illustrated in FIG. 15, a semiconductor device according to Embodiment 2 includes a plurality (two, for example) of the semiconductor modules 2A according to Embodiment 2. In the semiconductor device according to Embodiment 2, the semiconductor modules 2A can be arranged in parallel with the long sides thereof facing one another in order to achieve greater current capacity. The semiconductor device according to Embodiment 2 is different from the semiconductor device according to Embodiment 1 in that the semiconductor modules 2A are used. The rest of the configuration is similar to the semiconductor device according to Embodiment 1 and therefore will not be described again here.

Similar to the semiconductor device according to Embodiment 1 and illustrated in FIG. 10, the semiconductor device according to Embodiment 2 is housed within an outer case 37. The positive external terminals 31A, the negative external terminals 32A, the output external terminals 33A, control external terminals 34, and auxiliary external terminals 35 of the respective semiconductor modules 2A are exposed on an upper surface of the outer case 37. As described above, in each of the semiconductor modules 2A used in the semiconductor device according to Embodiment 2, the mutual inductance between the first terminals 7a1 and 7a2 and the second terminal 7b of each of the first semiconductor unit 1Aa and the second semiconductor unit 1Ab can be reduced. Moreover, the mutual inductance between the positive connector 31 and the negative connector 32 of each semiconductor module 2A can also be reduced. Furthermore, the mutual inductance between the connection plates that are electrically connected to the positive external terminals 31A and the negative external terminals 32A can also be reduced. Therefore, in the semiconductor device according to Embodiment 2, the respective parasitic inductance of each current path going from the connection plate that is connected to the positive external terminals 31A to the connection plate that is connected to the negative external terminals 32A can be reduced. This makes it possible to reduce the overall parasitic inductance of the semiconductor device according to Embodiment 2, thereby making it possible to suppress surge voltages applied during switching operation of the semiconductor modules 2A. Furthermore, in the semiconductor device according to Embodiment 2, near the center of each second semiconductor unit 1Ab, the auxiliary region 60 in which the output connector 33 connected to the output external terminal 33A is not arranged is formed. This makes it possible to simplify the wiring of the output connector 33.

(Inductance of Semiconductor Device)

The parasitic inductance of the semiconductor devices according to Embodiments 1 and 2 of the present invention was evaluated. The semiconductor device according to Embodiment 1 and illustrated in FIG. 8 was used as Working Example 1. The semiconductor device according to Embodiment 2 and illustrated in FIG. 15 was used as Working Example 2. Moreover, a semiconductor device having the conventional structure illustrated in FIGS. 16 and 17 was used as a comparison example.

Figure 16:
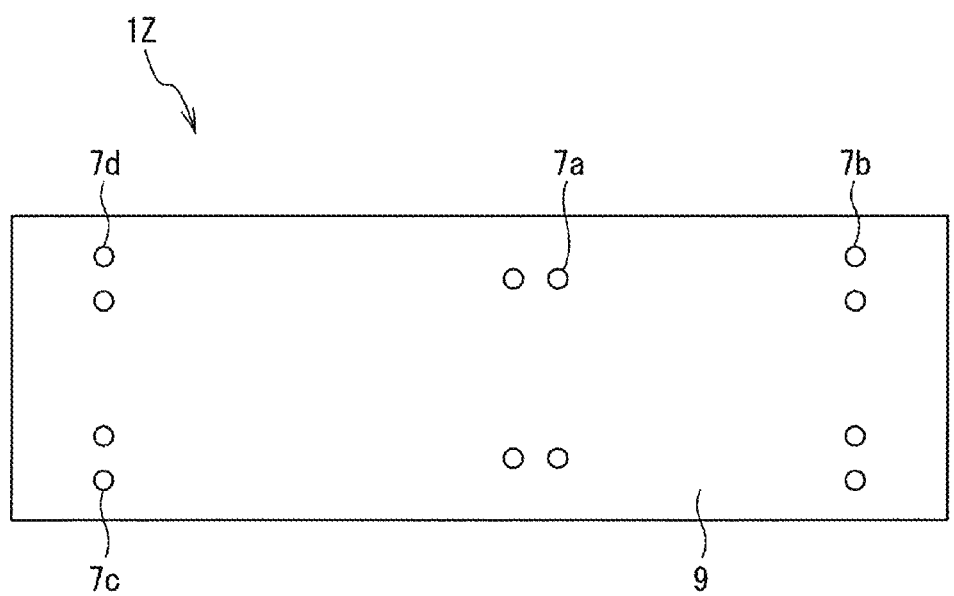
FIG. 16 is a plan view schematically illustrating an example of a conventional semiconductor unit.

FIG. 16 is a plan view illustrating the configuration of electrode terminals in a conventional semiconductor unit 1Z. As illustrated in FIG. 16, a first terminal 7a, a second terminal 7b, a control electrode terminal 7c, and an auxiliary electrode terminal 7d are arranged on an upper surface of a rectangular resin 9. The first terminal 7a is arranged, near the center of the resin 9 in the lengthwise direction thereof, between the second terminal 7b and the control electrode terminal 7c and auxiliary electrode terminal 7d. The second terminal 7b is arranged on one lengthwise end of the resin 9, and the control electrode terminal 7c and the auxiliary electrode terminal 7d are arranged on the other lengthwise end of the resin 9. The control electrode terminal 7c and the auxiliary electrode terminal 7d are arranged facing one another in the widthwise direction of the resin 9.

Figure 17:
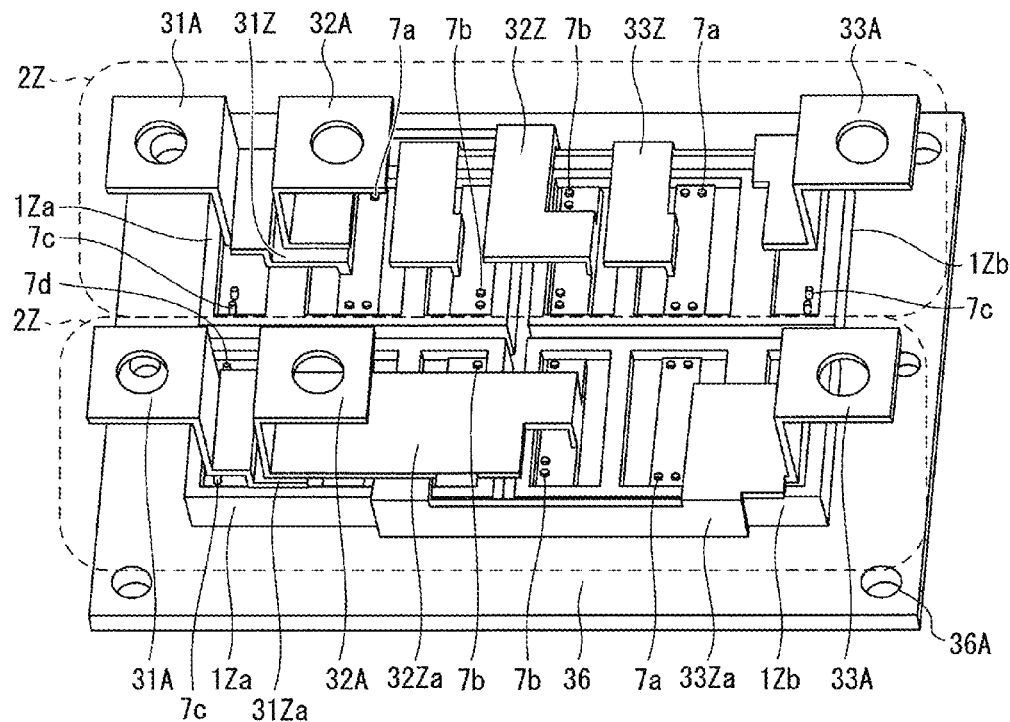
FIG. 17 is a perspective view illustrating an example of a semiconductor device according to a comparison example.

As illustrated in FIG. 17, a conventional semiconductor device includes two two-in-one semiconductor modules 2Z each constituted by semiconductor units 1Za and 1Zb. In each semiconductor module 2Z, the semiconductor unit 1Zb is rotated by 180° relative to the semiconductor unit 1Za such that the ends where the second terminals 7b are arranged are arranged facing one another. In the conventional semiconductor device, the semiconductor modules 2Z are arranged in parallel with the long sides thereof facing one another. A positive connector 31Z having a positive external terminal 31A formed on an end thereof is electrically connected to the first terminal 7a of the semiconductor unit 1Za. A negative connector 32Z having a negative external terminal 32A formed on an end thereof is electrically connected to the second terminal 7b of the semiconductor unit 1Zb. An output connector 33Z having an output external terminal 33A formed on an end thereof is electrically connected to the second terminal 7b of the semiconductor unit 1Za and the first terminal 7a of the semiconductor unit 1Zb. The positive connector 31Z, the negative connector 32Z, and the output connector 33Z are not flat plate-shaped and instead have complex shapes including stepped portions and bent portions and the like.

Figure 18:
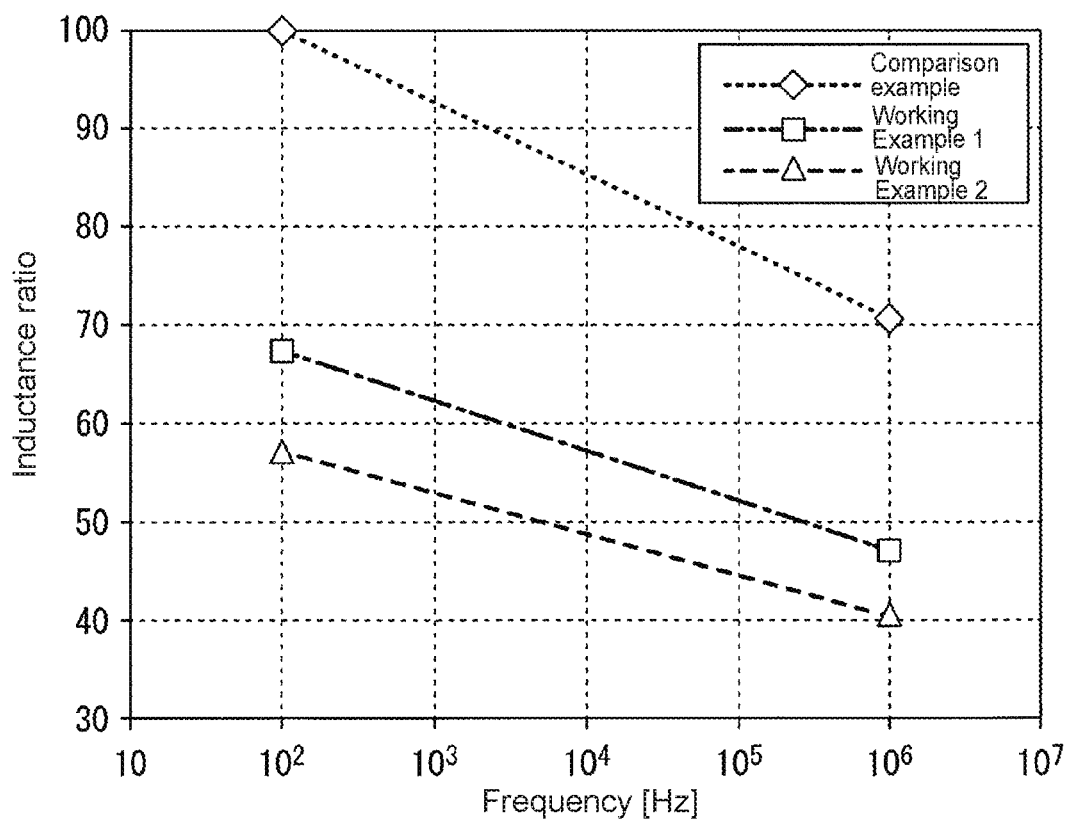
FIG. 18 is a graph showing examples of the results of evaluating the inductance of semiconductor devices according to working examples of the present invention.

FIG. 18 illustrates the results of measuring the impedance of Working Example 1, Working Example 2, and the comparison example using an impedance meter. In FIG. 18, "Inductance ratio" is the inductance ratio with the inductance of the comparison example as measured at a frequency of 100 Hz being set to a value of 100. As shown in the graph in FIG. 18, in comparison to the comparison example, inductance was reduced by more than 30% in Working Example 1 and by more than 40% in Working Example 2. In Working Example 1 and Working Example 2, on the paths for primary circuit current that flows through the switching devices, the outgoing paths and return paths are arranged near one another in a parallel manner, and current flows in opposite directions on the outgoing paths and return paths. This reduces mutual inductance, thereby making it possible to reduce the parasitic inductance of the semiconductor device. Moreover, as illustrated in FIG. 12, in the semiconductor device according to Embodiment 2, the first terminals 7a1 and 7a2 arranged on either side of the second terminal 7b are separated and arranged near both long sides of the first semiconductor unit 1Aa. This makes it possible to arrange the outgoing paths and return paths on the current paths between the respective first terminals 7a1 and 7a2 and the switching devices in a closer and more parallel manner. As a result, Working Example 2 (which corresponds to the semiconductor device according to Embodiment 2) makes it possible to reduce inductance to a greater degree than Working Example 1 (which corresponds to the semiconductor device according to Embodiment 1).

Other Embodiments

Figure 19:
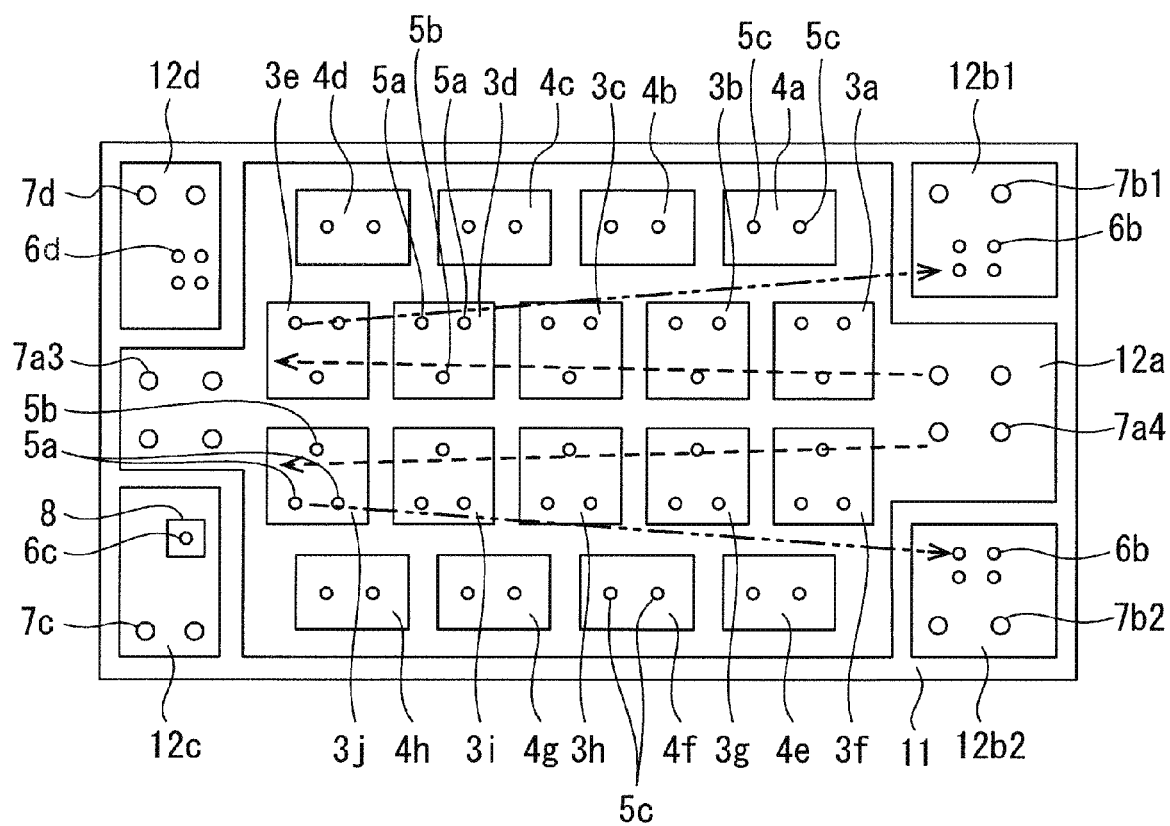
FIG. 19 is a plan view schematically illustrating an example of a semiconductor chip arrangement used in a semiconductor unit according to another embodiment of the present invention.

Although the present invention was described above with reference to Embodiments 1 and 2, the descriptions and drawings of this disclosure should not be understood to limit the present invention in any way. In Embodiments 1 and 2, the row of transistor chips 3a to 3e and the row of transistor chips 3f to 3j are arranged along both widthwise edges on either side of the diode chips 4a to 4h. However, the diode chips may be arranged along both edges on either side of the transistor chips. For example, as illustrated in FIG. 19, the transistor chips 3a to 3e and the transistor chips 3f to 3j are arranged in rows respectively running in the lengthwise direction along the widthwise center of the conductor layer 12a of the insulated circuit board 10. The diode chips 4a to 4d are arranged in a row between the transistor chips 3a to 3e and one widthwise edge. The diode chips 4e to 4h are arranged in a row between the transistor chips 3f to 3j and the other widthwise edge. A first terminal 7a4 is arranged in the widthwise center of one end of the conductor layer 12a so as to face the transistor chips 3a and 3f. A third terminal 7a3 is arranged on the other end of the conductor layer 12a so as to face the transistor chips 3e and 3j. Moreover, on one lengthwise end, conductor layers 12b1 and 12b2 are arranged near both widthwise edges on either side of the conductor layer 12a. A second terminal 7b1 and conductive posts 6b are arranged on the conductor layer 12b1, and a second terminal 7b2 and conductive posts 6b are arranged on the conductor layer 12b2. Even when the diode chips 4a to 4h are arranged along both edges on either side of the row of transistor chips 3a to 3e and the row of transistor chips 3f to 3j, the outgoing paths and return paths on the current paths can still be arranged near one another in a parallel manner, thereby making it possible to reduce inductance.

Upon understanding the key points of the above disclosure of embodiments, it would be apparent to a person skilled in the art that various alternative embodiments, working examples, and applied technologies could be included within the present invention. Moreover, the present invention includes various other embodiments and the like that are not explicitly described here, such as configurations achieved by freely applying aspects of the embodiments and modification examples described above. Accordingly, the technical scope of the present invention is defined only by the characterizing features of the invention as set forth in the claims, which are appropriately derived from the exemplary descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor unit, comprising:
   a plurality of transistor chips arranged in a plurality of parallel rows each extending in a first direction, each transistor chip respectively having a first main electrode on a bottom surface and a second main electrode on a top surface;
   a first conductor layer under the plurality transistor chips so as to be in contact with and electrically connected to the first main electrodes of the transistor chips, a first conductor layer having a terminal region on which a first external terminal vertically extending upwards is provided, the terminal region extending from one end of at least one of the parallels rows of the transistors in a plan view so as to provide a current path generally parallel to the first direction between the first external terminal and the first main electrodes of the row of the transistors from which the terminal region extends;
   a second conductor layer disposed in a same plane as the first conductor layer, the second conductor layer being arranged adjacent to the terminal region of the first conductor layer at a position that is generally aligned with the terminal region of the first conductor layer in a second direction perpendicular to the first direction, the second conductor layer having a second external terminal and a conductive post thereon both vertically extending upwards; and
   a wiring substrate above the plurality of transistor chips, including a wiring layer electrically connected to each of the second main electrodes of the plurality of transistor chips, the wiring substrate laterally extending to a region above the second conductor layer and the wiring layer being in contact with and electrically connected to the second conductor layer via the conductive post.

2. The semiconductor unit according to claim 1, wherein the terminal region having the first external terminal is provided at each of two corners of the first conductor layer at one side in the first direction, and the second conductor layer is arranged between the terminal regions at the two corners.

3. The semiconductor unit according to claim 2, wherein respective edge regions of the second conductor layer in the second direction fall along lines in which the respective rows of the plurality of transistor chips run in the first direction, the second conductor layer being electrically connected to the wiring layer at the edge regions via the conductive post that is provided in each of the edge regions.

4. The semiconductor unit according to claim 3, further comprising a plurality of diode chips on the first conductor layer arranged in a row or a plurality of parallel row extending in the first direction and electrically connected in anti-parallel to the transistor chips.

5. The semiconductor unit according to claim 3, wherein a center portion of another side of the first conductor layer that is opposite to the side of said two corners has another terminal region extending in a direction opposite to the first direction on which a third external terminal vertically extending upwards is provided.

6. The semiconductor unit according to claim 5, further comprising:
   conductive posts respectively connecting the second main electrodes of the plurality of transistor chips to the wiring layer; and
   a resin block sealing the transistor chips, the first conductor layer, the second conductor layer, and the wiring substrate therein, the resin block exposing respective tips of said first, second, and third external terminals to an exterior of the resin block.

7. The semiconductor unit according to claim 2, further comprising a plurality of diode chips on the first conductor layer arranged in a row or a plurality of parallel row extending in the first direction and electrically connected in anti-parallel to the transistor chips.

8. The semiconductor unit according to claim 2, wherein a center portion of another side of the first conductor layer that is opposite to the side of said two corners has another terminal region extending in a direction opposite to the first direction on which a third external terminal vertically extending upwards is provided.

9. The semiconductor unit according to claim 8, further comprising:
   conductive posts respectively connecting the second main electrodes of the plurality of transistor chips to the wiring layer; and
   a resin block sealing the transistor chips, the first conductor layer, the second conductor layer, and the wiring substrate therein, the resin block exposing respective tips of said first, second, and third external terminals to an exterior of the resin block.

10. The semiconductor unit according to claim 1, further comprising a plurality of diode chips on the first conductor layer arranged in a row or a plurality of parallel row extending in the first direction and electrically connected in anti-parallel to the transistor chips.

11. A semiconductor module, comprising:
the semiconductor unit as set forth in claim 1, provided in pair, one of which being a first semiconductor unit and another of which being a second semiconductor unit, the first semiconductor unit and the second semiconductor unit being rotated 180 degrees relative to each other and being disposed side-by-side with each other in the first direction;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit,
wherein a main surface of the positive connector and a main surface of the negative connector are arranged above and parallel to an upper surface of the first semiconductor unit so as to be separated from and face one another in a vertical direction above the first semiconductor unit.

12. A semiconductor module, comprising:
the semiconductor unit as set forth in claim 2, provided in pair, one of which being a first semiconductor unit and another of which being a second semiconductor unit, the first semiconductor unit and the second semiconductor unit being rotated 180 degrees relative to each other and being disposed side-by-side with each other in the first direction so that said two corners of the first and second semiconductor units face each other;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit;
wherein a main surface of the positive connector and a main surface of the negative connector are arranged above and parallel to an upper surface of the first semiconductor unit so as to be separated from and face one another in a vertical direction above the first semiconductor unit,
wherein in the second semiconductor unit, a center portion of another side of the first conductor layer that is opposite to the side of said two corners has another terminal region extending in a direction opposite to the first direction on which a third external terminal vertically extending upwards is provided,
wherein the output external terminal is physically and electrically connected to said third external terminal of the second semiconductor unit, and
wherein the second external terminal of the first semiconductor unit and the first external terminals of the second semiconductor unit on the terminal regions at the two corners of the first conductor layer are physically bridged and electrically connected to each other via a middle connector.

13. A semiconductor module, comprising:
the semiconductor unit as set forth in claim 3, provided in pair, one of which being a first semiconductor unit and another of which being a second semiconductor unit, the first semiconductor unit and the second semiconductor unit being rotated 180 degrees relative to each other and being disposed side-by-side with each other in the first direction so that said two corners of the first and second semiconductor units face each other;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit;
wherein a main surface of the positive connector and a main surface of the negative connector are arranged above and parallel to an upper surface of the first semiconductor unit so as to be separated from and face one another in a vertical direction above the first semiconductor unit,
wherein in the second semiconductor unit, a center portion of another side of the first conductor layer that is opposite to the side of said two corners has another terminal region extending in a direction opposite to the first direction on which a third external terminal vertically extending upwards is provided,
wherein the output external terminal is physically and electrically connected to said third external terminal of the second semiconductor unit, and
wherein the second external terminal of the first semiconductor unit and the first external terminals of the second semiconductor unit on the terminal regions at the two corners of the first conductor layer are physically bridged and electrically connected to each other via a middle connector.

14. A semiconductor module, comprising:
the semiconductor unit as set forth in claim 10, provided in pair, one of which being a first semiconductor unit and another of which being a second semiconductor unit, the first semiconductor unit and the second semiconductor unit being rotated 180 degrees relative to each other and being disposed side-by-side with each other in the first direction;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit,
wherein a main surface of the positive connector and a main surface of the negative connector are arranged above and parallel to an upper surface of the first semiconductor unit so as to be separated from and face one another in a vertical direction above the first semiconductor unit.

15. A semiconductor module, comprising:
the semiconductor unit as set forth in claim 7, provided in pair, one of which being a first semiconductor unit and another of which being a second semiconductor unit, the first semiconductor unit and the second semiconductor unit being rotated 180 degrees relative to each other and being disposed side-by-side with each other in the first direction so that said two corners of the first and second semiconductor units face each other;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit;
wherein a main surface of the positive connector and a main surface of the negative connector are arranged above and parallel to an upper surface of the first semiconductor unit so as to be separated from and face one another in a vertical direction above the first semiconductor unit,
wherein in the second semiconductor unit, a center portion of another side of the first conductor layer that is opposite to the side of said two corners has another terminal region extending in a direction opposite to the first direction on which a third external terminal vertically extending upwards is provided,
wherein the output external terminal is physically and electrically connected to said third external terminal of the second semiconductor unit, and
wherein the second external terminal of the first semiconductor unit and the first external terminals of the second semiconductor unit on the terminal regions at the two corners of the first conductor layer are physically bridged and electrically connected to each other via a middle connector.

16. A semiconductor module, comprising:
the semiconductor unit as set forth in claim 4, provided in pair, one of which being a first semiconductor unit and another of which being a second semiconductor unit, the first semiconductor unit and the second semiconductor unit being rotated 180 degrees relative to each other and being disposed side-by-side with each other in the first direction so that said two corners of the first and second semiconductor units face each other;
a positive external terminal electrically connected via a positive connector to the first external terminal of the first semiconductor unit;
a negative external terminal electrically connected via a negative connector to the second external terminal of the second semiconductor unit; and
an output external terminal electrically connected to the second external terminal of the first semiconductor unit and the first external terminal of the second semiconductor unit;
wherein a main surface of the positive connector and a main surface of the negative connector are arranged above and parallel to an upper surface of the first semiconductor unit so as to be separated from and face one another in a vertical direction above the first semiconductor unit,
wherein in the second semiconductor unit, a center portion of another side of the first conductor layer that is opposite to the side of said two corners has another terminal region extending in a direction opposite to the first direction on which a third external terminal vertically extending upwards is provided,
wherein the output external terminal is physically and electrically connected to said third external terminal of the second semiconductor unit, and
wherein the second external terminal of the first semiconductor unit and the first external terminals of the second semiconductor unit on the terminal regions at the two corners of the first conductor layer are physically bridged and electrically connected to each other via a middle connector.

17. A semiconductor device comprising the semiconductor module set forth in claim 11 provided in a plurality, the plurality of the semiconductor modules being housed within an outer case, with the positive external terminal, the negative external terminal, and the output external terminal of each of the semiconductor modules being respectively exposed to an exterior.

18. A semiconductor device comprising the semiconductor module set forth in claim 12 provided in a plurality, the plurality of the semiconductor modules being housed within an outer case, with the positive external terminal, the negative external terminal, and the output external terminal of each of the semiconductor modules being respectively exposed to an exterior.

19. A semiconductor device comprising the semiconductor module set forth in claim 13 provided in a plurality, the plurality of the semiconductor modules being housed within an outer case, with the positive external terminal, the negative external terminal, and the output external terminal of each of the semiconductor modules being respectively exposed to an exterior.

20. A semiconductor device comprising the semiconductor module set forth in claim 14 provided in a plurality, the plurality of the semiconductor modules being housed within an outer case, with the positive external terminal, the negative external terminal, and the output external terminal of each of the semiconductor modules being respectively exposed to an exterior.

* * * * *